United States Patent
Liu et al.

(10) Patent No.: US 10,848,221 B2
(45) Date of Patent: Nov. 24, 2020

(54) SECTOR LEVEL SWEEP METHOD AND APPARATUS

(71) Applicant: HUAWEI TECHNOLOGIES CO., LTD., Shenzhen (CN)

(72) Inventors: Jinnan Liu, Beijing (CN); Dejian Li, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/563,950

(22) Filed: Sep. 9, 2019

(65) Prior Publication Data
US 2020/0007211 A1 Jan. 2, 2020

Related U.S. Application Data

(63) Continuation of application No. PCT/CN2017/076193, filed on Mar. 9, 2017.

(51) Int. Cl.
*H04B 7/06* (2006.01)
*H03M 13/11* (2006.01)
*H04B 7/0491* (2017.01)

(52) U.S. Cl.
CPC ...... *H04B 7/0617* (2013.01); *H03M 13/1102* (2013.01); *H04B 7/0491* (2013.01); *H04B 7/0695* (2013.01)

(58) Field of Classification Search
CPC .. H04B 7/0617; H04B 7/0695; H04B 7/0491; H04B 7/088; H03M 13/1102; H04W 16/28
See application file for complete search history.

(56) References Cited

U.S. PATENT DOCUMENTS

| | | | |
|---|---|---|---|
| 2016/0329947 A1 | 11/2016 | Jo et al. | |
| 2017/0134076 A1* | 5/2017 | Maamari | H04B 7/0452 |
| 2017/0264350 A1* | 9/2017 | Sanderovich | H04B 7/0632 |
| 2018/0317042 A1* | 11/2018 | Kasher | H04W 64/006 |
| 2019/0349782 A1* | 11/2019 | Kim | H04B 7/063 |
| 2020/0044337 A1* | 2/2020 | Abdallah | H04B 7/088 |

OTHER PUBLICATIONS

ISO/IEC/IEEE 8802-11 Information technology—Telecommunications and information.
IEEE Std 802.11™-2016(Revision of IEEE Std 802.11-2012),Part 11: Wireless LAN Medium Access Control (MAC) and Physical Layer (PHY) Specifications,IEEE Computer Society,Sponsored by the LAN/MAN Standards Committee, total 3534 pages.

(Continued)

*Primary Examiner* — Dac V Ha
(74) *Attorney, Agent, or Firm* — Kilpatrick Townsend & Stockton LLP

(57) ABSTRACT

A sector level sweep method and apparatus are provided. A local end generates a first sector sweep packet at the local end sector sweep stage, and the local end sends the first sector sweep packet to a peer end by using a first beam. A quantity of bytes of the first sector sweep packet is not greater than 27, the first sector sweep packet includes beam indication information of the first beam, the beam indication information includes antenna identification information of the beam, and a maximum quantity of antennas indicated by the antenna identification information is at least 8.

20 Claims, 6 Drawing Sheets

(56) References Cited

OTHER PUBLICATIONS

IEEE P802.11ay™/D0.2 Amendment 7: Enhanced throughput for operation in license-exempt bands above 45 GHz, IEEE Computer Society, Jan. 2017, total 196 pages.
IEEE Std 802.11ad™-2012 Part 11: Wireless LAN Medium Access Control (MAC) and Physical Layer (PHY) Specifications, Amendment 3: Enhancements for Very High Throughput in the 60 GHz Band, IEEE Computer Society, dated Oct. 19, 2012, total 628 pages.

* cited by examiner

SECTOR LEVEL SWEEP METHOD AND APPARATUS

CROSS-REFERENCE TO RELATED APPLICATIONS

This application is a continuation of International Application No. PCT/CN2017/076193, filed on Mar. 9, 2017, the disclosure of which is hereby incorporated by reference in its entirety.

TECHNICAL FIELD

This application relates to the field of wireless communications technologies, and in particular, to a sector level sweep method and apparatus.

BACKGROUND

In high-frequency communication, especially on a millimeter-wave band, attenuation of a transmit signal is far greater than that in a case of a low frequency (6 GHz). To resist signal attenuation in the high-frequency communication, a signal is usually sent by using a beam.

The IEEE 802.11ad standard defines a beam training manner for a single data stream, so as to obtain a preferred transmit/receive beam of an initiator and a preferred transmit/receive beam of a responder, and perform reliable directional transmission between a transmit end and a receive end, to resist signal attenuation. The beam training manner includes two procedures: sector level sweep (Sector Level Sweep, SLS) and beam refinement (Beam Refinement Protocol, BRP). In the two procedures, in two devices that perform beam training, a station (Station, STA) that initiates the beam training may be referred to as an initiator, and a STA that responds to the initiator may be referred to as a responder.

In an existing SLS procedure, the initiator and the responder may perform transmit/receive beam training by mutually transmitting a sector sweep (Sector Sweep, SSW) frame. To increase a data rate, a multi-antenna technology is introduced in the IEEE 802.11ay standard based on the IEEE 802.11ad standard. During SLS training, training on a plurality of antennas is allowed. In addition, as multi-antennas are introduced, a quantity of beams that need to be trained by a single device greatly increases. However, multi-antennas that can be indicated by the sector sweep frame, such as a directional multi-gigabit (Directional Multi-Gigabit, DMG) SSW frame or a DMG beacon frame, transmitted in the conventional existing SLS procedure cannot meet a current scenario of a plurality of antennas.

SUMMARY

Embodiments of this application provide a sector level sweep method and apparatus, so that a quantity of antennas that can be indicated by a sector sweep packet in an SLS procedure meets a current multi-antenna requirement, and a transmission latency of the sector sweep packet does not excessively increase.

According to a first aspect, an embodiment of this application provides a sector level sweep method. In the method, a local end generates a first sector sweep packet at a local end sector sweep stage. In this embodiment of this application, optionally, the first sector sweep packet may include an SSW frame and a short SSW packet. The SSW frame may include a DMG SSW frame defined in the prior art, or may include an EDMG SSW frame redefined in the embodiments of this application. The short SSW packet newly introduced in IEEE 802.11ay currently includes no MAC header, and therefore is referred to as the short SSW packet. The local end sends the first sector sweep packet to a peer end by using a first beam. Optionally, a quantity of bytes of the first sector sweep packet is not greater than 27. The first sector sweep packet includes beam indication information of the first beam, the beam indication information includes antenna identification information of the beam, and a maximum quantity of antennas indicated by the antenna identification information is at least 8.

It can be learned through analysis that, the first sector sweep packet includes the beam indication information of the first beam, the beam indication information includes the antenna identification information of the beam, and the maximum quantity of antennas indicated by the antenna identification information is at least 8. In other words, the first sector sweep packet can indicate at least eight antennas. In addition, current multi-antenna application scenarios include a scenario with eight data streams. Therefore, a quantity of antennas that can be indicated by the first sector sweep packet can meet a current multi-antenna requirement. In addition, for a throughput requirement, a quantity of streams that need to be supported may further increase, and therefore a quantity of antennas that need to be indicated is extended.

In addition, because the quantity of bytes of the first sector sweep packet is not greater than 27, it may be determined through the foregoing calculation that a quantity of LDPC code blocks corresponding to the first sector sweep packet is not greater than 2. In addition, the quantity of LDPC code blocks corresponding to the first sector sweep packet is not greater than 2, and a current protocol specifies that a sector sweep packet corresponds to two LDPC code blocks. In this embodiment of this application, although the quantity of antennas that can be indicated by the first sector sweep packet increases, the quantity of LDPC code blocks corresponding to the first sector sweep packet does not increase. Therefore, in this embodiment of this application, a transmission latency of the sector sweep packet does not excessively increase, and a relatively large increase of transmission overheads is not caused.

Optionally, the beam indication information of the beam further includes beam identification information of the beam. In EDMG BRP training, a maximum quantity of antenna weight vectors (AWV, Antenna Weight Vector) that can be trained on each antenna has been extended to 2048. Therefore, in the first sector sweep packet provided in this embodiment of this application, a maximum quantity of beams indicated by the beam identification information of the beam is at least 2048. In this way, in this embodiment of this application, a quantity of beams that is of a single antenna and that can be indicated also increases, and is consistent with that at a BRP stage.

Optionally, for each of the local end sector sweep stage and a peer end sector sweep stage, a total quantity of sector sweep packets sent at each stage may be indicated by using countdown identification information at the sector sweep stage. The beam indication information further includes countdown identification information corresponding to the beam at the local end sector sweep stage, and a maximum quantity of beams indicated by the countdown identification information of the beam is at least 16384. In this way, in this embodiment of this application, a quantity of beams that can be indicated at the entire local end sector sweep stage also increases.

In an optional implementation solution, the quantity of bytes of the first sector sweep packet is still 26. In this embodiment of this application, this may be implemented by redefining some fields in a DMG SSW frame in an existing protocol. Optionally, that a local end generates a first sector sweep packet includes: adding, by the local end, the beam indication information of the first beam to a beam indication information field in the first sector sweep packet, to generate the first sector sweep packet, where the beam indication information field includes an extended beam indication information field and a first indication information field, and if the sector sweep packet at the local end sector sweep stage has 26 bytes, the first indication information field is used to instruct to define any one or more of a receive sector sweep length field in an SSW field in a DMG SSW frame, a signal-to-noise ratio report field in an SSW feedback field, and a reserved bit field as the extended beam indication information field. In this way, when the quantity of antennas that can be indicated by the first sector sweep packet increases, a length of the DMG SSW frame does not increase.

Based on the foregoing content, optionally, the first sector sweep packet or a second sector sweep packet in this embodiment of this application further includes the SSW feedback field, used to feed back preferred beam indication information at a previous stage. Optionally, before the local end generates the sector sweep packet, the method further includes: receiving, by the local end, a second sector sweep packet by using a second beam at a previous peer end sector sweep stage adjacent to the local end sector sweep stage, where the second sector sweep packet includes beam indication information of the second beam, and a quantity of bytes of the second sector sweep packet is not greater than 27; and that a local end generates a first sector sweep packet includes: selecting, by the local end, to-be-fed-back beam indication information of each of at least one first to-be-fed-back beam from the sector sweep packet received at the previous peer end sector sweep stage adjacent to the local end sector sweep stage; and generating, by the local end, the first sector sweep packet based on the to-be-fed-back beam indication information of each of the at least one first to-be-fed-back beam and the beam indication information of the first beam, where the to-be-fed-back beam indication information includes beam identification information of the to-be-fed-back beam, and a maximum quantity of beams indicated by the beam identification information of the to-be-fed-back beam is at least 2048.

In an optional implementation solution, optionally, the to-be-fed-back beam indication information further includes antenna identification information of the to-be-fed-back beam, and a maximum quantity of antennas indicated by the antenna identification information of the to-be-fed-back beam is at least 8. If binary is used for representation, 3 bits are provided for the antenna identification information of the to-be-fed-back beam, and may indicate antenna identification information of eight to-be-fed-back beams.

Optionally, the first sector sweep packet includes 27 bytes, and the local end selects at least two first to-be-fed-back beams from the sector sweep packet received at the previous peer end sector sweep stage adjacent to the local end sector sweep stage. In this way, a bit corresponding to the antenna identification information of the to-be-fed-back beam can be saved. Further, a plurality of to-be-fed-back beams such as an optimal beam and a suboptimal beam on an antenna may be fed back. In other words, the bit saved in the solution provided in this embodiment of this application is used to transmit more to-be-fed-back beams.

Optionally, after the local end sends the first sector sweep packet to a peer end by using a first beam, the method further includes: sending a sector sweep feedback frame to the peer end, and receiving a sector sweep acknowledgement frame sent by the peer end; or receiving a sector sweep feedback frame sent by the peer end, and sending a sector sweep acknowledgement frame to the peer end. For each of the sector sweep feedback frame and the sector sweep acknowledgement frame, a quantity of occupied bytes is not greater than 48, and a quantity of occupied LDPC code blocks is not greater than 3.

Optionally, each of the sector sweep feedback frame and the sector sweep acknowledgement frame includes at least two sector sweep feedback fields, and each of the at least two sector sweep feedback fields includes to-be-fed-back beam indication information of at least two third to-be-fed-back beams corresponding to a same antenna. In this way, a plurality of to-be-fed-back beams may be fed back.

Optionally, after the local end sends the first sector sweep packet to a peer end by using a first beam, the method further includes: receiving, by the local end, a third sector sweep packet by using a third beam at a subsequent peer end sector sweep stage adjacent to the local end sector sweep stage, where the third sector sweep packet includes to-be-fed-back beam indication information that is of a second to-be-fed-back beam and that is selected by the peer end from the sector sweep packet received at the local end sector sweep stage. Optionally, the first sector sweep packet further includes indication information used to indicate whether a local end sector sweep stage next to the local end sector sweep stage exists. In this way, an entire SLS stage is divided into a plurality of segments by mutually spaced ISS and RSS. In addition, a time of obtaining a feedback result of a previous sector sweep stage may be advanced, and the local end and the peer end each may obtain a beam training result before a sector sweep feedback frame transmission stage and a sector sweep acknowledgement frame transmission stage.

This embodiment of this application provides an optional solution. If the sector sweep packet is a short SSW packet, information about a physical layer service data unit length field in the short SSW packet is 6, and the local end adds beam indication information at the local end sector sweep stage to the sector sweep packet at the local end sector sweep stage, including: adding, by the local end, the beam indication information at the local end sector sweep stage to a beam indication information field that is at the local end sector sweep stage and that is in the sector sweep packet at the local end sector sweep stage, where the beam indication information field at the local end sector sweep stage includes the beam indication information field at the local end sector sweep stage, a beam information indication field obtained after extension at the local end sector sweep stage, and a second indication information field, and the second indication information field is used to define any one or more of a frame check sequence field, a packet type field, and a reserved bit field in the short SSW packet as the beam information indication field obtained after the extension at the local end sector sweep stage. The frame check sequence field may also be referred to as an FCS field in the short SSW packet. The packet type field may also be referred to as a packet type field in the short SSW packet. The reserved bit field may also be referred to as a reserved field in the short SSW packet. In this way, when a length of the DMG SSW frame does not increase, the quantity of antennas that can be indicated by the first sector sweep packet increases.

According to a second aspect, an embodiment of this application provides a sector level sweep apparatus. The sector level sweep apparatus includes a memory, a transceiver, and a processor. The memory is configured to store an instruction. The processor is configured to: execute the instruction stored in the memory, and control the transceiver to receive a signal and send a signal. When the processor executes the instruction stored in the memory, the sector level sweep apparatus is configured to perform the first aspect or any method in the first aspect.

According to a third aspect, an embodiment of this application provides a sector level sweep apparatus, configured to implement the first aspect or any method in the first aspect. The sector level sweep apparatus includes corresponding functional modules that are respectively configured to implement steps in the foregoing method.

According to a fourth aspect, an embodiment of this application provides a computer readable storage medium. The computer readable storage medium stores an instruction. When the instruction runs on a computer, the computer performs the method according to the first aspect or any possible implementation of the first aspect.

According to a fifth aspect, an embodiment of this application provides a computer program product including an instruction. When the computer program product runs on a computer, the computer performs the method according to the first aspect or any possible implementation of the first aspect.

In the embodiments of this application, the local end generates the first sector sweep packet, and the local end sends the first sector sweep packet to the peer end by using the first beam. The first sector sweep packet includes the beam indication information of the first beam, the beam indication information includes the antenna identification information of the beam, and the maximum quantity of antennas indicated by the antenna identification information is at least 8. In other words, the first sector sweep packet can indicate at least eight antennas. In addition, a current multi-antenna application scenario includes transmission of eight data streams, and support of a plurality of beams corresponding to at least eight antennas is required. Therefore, a quantity of antennas that can be indicated by the first sector sweep packet can meet a requirement that a system supports eight data streams. In addition, because the quantity of bytes of the first sector sweep packet is not greater than 27, although a coding manner of DMG MCS 0 is used, a quantity of low-density parity-check (Low-Density Parity-check Code, LDPC) code blocks corresponding to the first sector sweep packet is not greater than 2, and is the same as a quantity of LDPC code blocks in a conventional 26-byte DMG SSW frame. Therefore, in the embodiments of this application, although the quantity of antennas that can be indicated by the first sector sweep packet is extended, the quantity of LDPC code blocks corresponding to the first sector sweep packet does not increase. Therefore, in the embodiments of this application, a transmission latency of the sector sweep packet does not excessively increase.

BRIEF DESCRIPTION OF DRAWINGS

To describe the technical solutions in the embodiments of this application more clearly, the following briefly describes the accompanying drawings required for describing the embodiments.

DESCRIPTION OF EMBODIMENTS

To make the objectives, technical solutions, and beneficial effects of this application clearer and more comprehensible, the following further describes this application in detail with reference to the accompanying drawings and embodiments.

Figure 1:
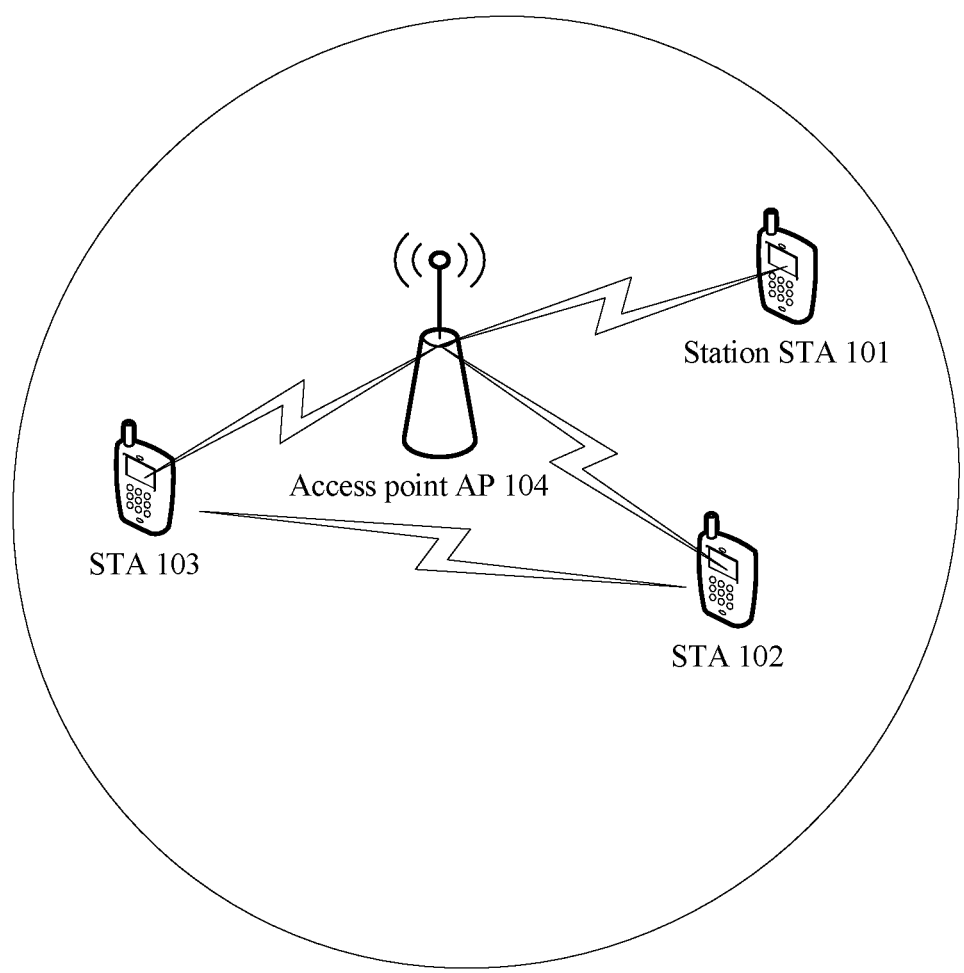
FIG. 1 is a schematic diagram of an application scenario according to an embodiment of this application.

The embodiments of this application are applicable to a sector level sweep procedure in beam training in high-frequency communication. FIG. 1 is a schematic diagram of an application scenario according to an embodiment of this application. As shown in FIG. 1, the scenario includes a network device and a terminal. The terminal may be a STA in another subsequent evolved standard of IEEE 802.11ay or 802.11ad, and is also referred to as an enhanced directional multi-gigabit (Enhanced Directional Multi-Gigabit, EDMG) STA. The terminal may be a handheld device or a computing device integrating a wireless communication function, another processing device connected to a wireless modem, an in-vehicle device, a wearable device, a terminal device in a future 5G network, or the like.

As shown in FIG. 1, for example, the network device may be an access point (Access Point, AP) 104 in FIG. 1, and the terminal may be a station (Station, STA) in FIG. 1. The AP 104 is connected to the STA in a wireless manner and/or a wired manner, and the STA is, for example, a STA 101, a STA 102, and a STA 103 shown in FIG. 1. Compared with a conventional IEEE 802.11ad device, in an IEEE 802.11ay device, some content using a DMG format may be labeled with DMG; legacy, or non-EDMG (Non EDMG), and a new feature of IEEE 802.11ay is labeled with EDMG for differentiation.

In FIG. 1, when the AP initiates beam training, the AP may be referred to as an initiator, and the STA may be referred to as a responder. When the STA initiates beam training, the STA may be referred to as an initiator, and the AP may be referred to as a responder. In other words, in this scenario, an end initiating beam training may be referred to as an initiator, and an end responding to the beam training may be referred to as a responder. Optionally, in some other application scenarios, an end initiating beam training may be alternatively referred to as a responder, and an end responding to the beam training may be referred to as an initiator. Alternatively, in some scenarios, one end is always referred to as an initiator, and the other end is always referred to as a responder. The initiator initiates beam training, or may respond to beam training initiated by the responder. The responder initiates beam training, or may respond to beam training initiated by the initiator. In two ends that perform beam training in the embodiments of this application, one end is referred to as a local end, and the other end is referred to as a peer end. The local end may be an initiator or a responder, and the peer end may also be an initiator or a responder. In addition, the local end may initiate beam training, or may respond to beam training initiated by the peer end. The peer end may initiate beam training, or may respond to beam training initiated by the local end.

Figure 1A:
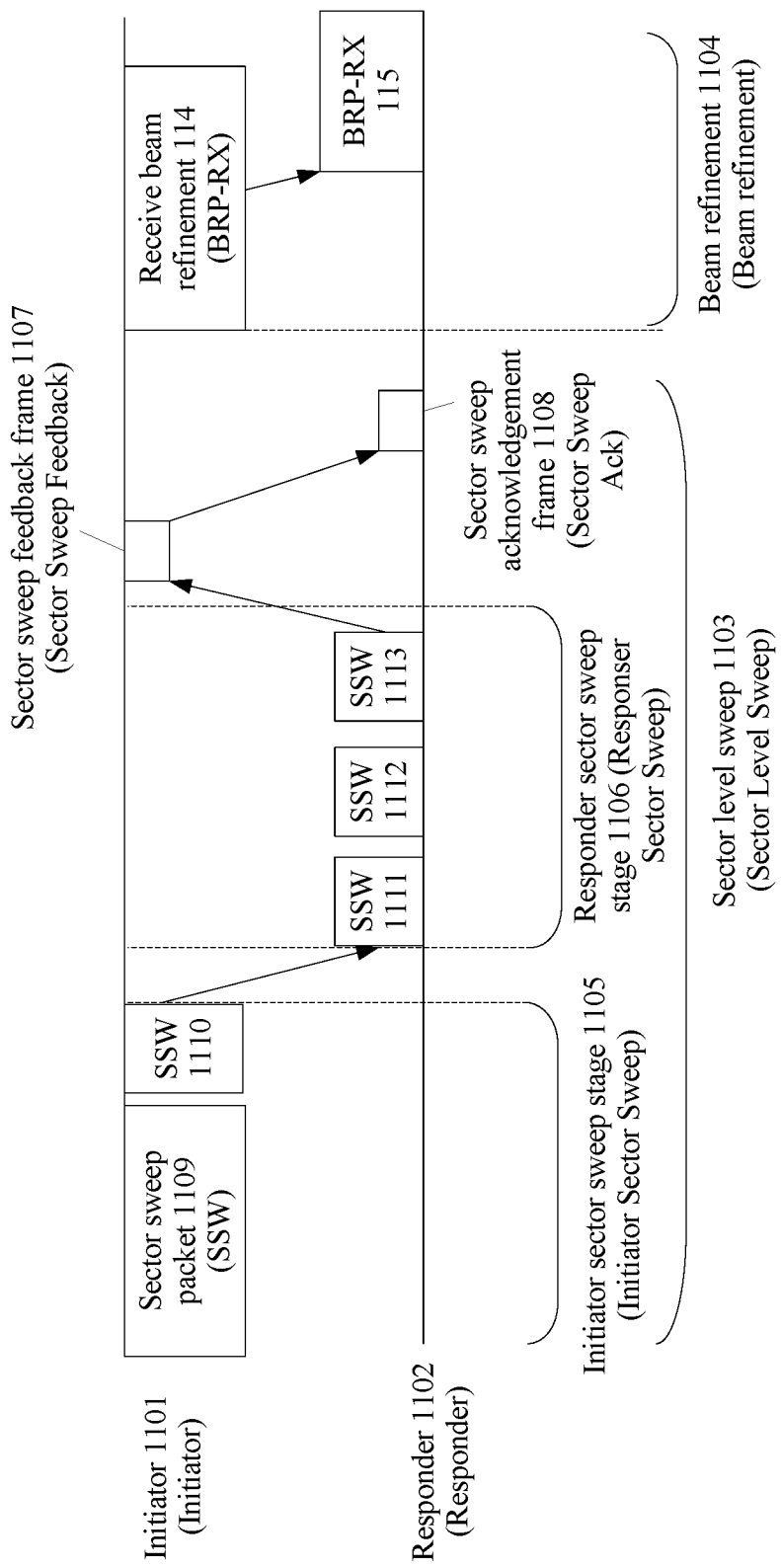
FIG. 1*a* is a schematic diagram of a beam training procedure according to an embodiment of this application.

For example, FIG. 1a is a schematic diagram of a beam training procedure according to an embodiment of this application. As shown in FIG. 1a, the beam training procedure includes an initiator (Initiator) 1101 and a responder (Responder) 1102. The beam training procedure includes two procedures: SLS 1103 and BRP 1104. The procedure SLS 1103 includes four stages, which are respectively an initiator sector sweep (Initiator Sector Sweep, ISS) stage 1105, a responder sector sweep (Responder Sector Sweep, RSS) stage 1106, a transmission stage of a sector sweep feedback (SSW Feedback) frame 1107, and a transmission stage of a sector sweep acknowledgement (SSW Ack, acknowledgement) frame 1108. A basic link between a local end and a peer end (namely, the initiator and the responder) is established through the four stages. The initiator may obtain an optimal transmit sector sent to the responder, and the responder may also obtain an optimal transmit sector sent to the initiator, in other words, may select a transmit beam and use a transmit beam gain.

At the ISS stage 1105 and the RSS stage 1106, a plurality of sector sweep packets may be transmitted between the initiator 1101 and the responder 1102. If the sector sweep packet includes a medium access control (Medium Access Control, MAC) header, the sector sweep packet may also be referred to as a sector sweep frame. In this embodiment of this application, the sector sweep packet is used to perform a beam sweep function, and may include an SSW packet or an SSW frame. The SSW packet may include a short SSW packet, and the SSW frame may include a DMG SSW frame and an EDMG SSW frame. In the short SSW packet and the DMG SSW frame, some fields may be reinterpreted because an antenna quantity or a sector quantity is extended. The EDMG SSW frame is a sweep frame type newly defined in this application.

At the ISS stage 1105, the initiator 1101 sends sector sweep packets such as an SSW packet 1109 and an SSW packet 1110 to the responder 1102, to perform transmit beam training or receive beam training of the initiator 1101. At the RSS stage, the responder 1102 may send sector sweep packets such as an SSW packet 1111, an SSW packet 1112, and an SSW packet 1113, to perform transmit beam training or receive beam training of the responder 1102.

At the transmission stage of the sector sweep feedback frame 1107, the sector sweep feedback frame 1107 may be transmitted between the initiator 1101 and the responder 1102. At the transmission stage of the sector sweep acknowledgement frame 1108, the sector sweep acknowledgement frame 1108 may be transmitted between the initiator 1101 and the responder 1102. A result of the stages of the SLS 1103 may be determined by using the beam sweep feedback frame 1107 and the sector sweep acknowledgement frame 1108, and whether beam refinement needs to be performed is determined by using the beam sweep feedback frame 1107 and the sector sweep acknowledgement frame 1108. The sector sweep feedback frame sent at the sector sweep stage includes a DMG beam sweep feedback frame, or an EDMG beam sweep feedback frame newly defined in this application. Correspondingly, the sector sweep acknowledgement frame sent at the beam sweep stage includes a DMG beam sweep acknowledgement frame, or an EDMG beam sweep acknowledgement frame newly defined in this application. Because an antenna quantity or a sector quantity is extended in this application, some fields in the DMG beam sweep acknowledgement frame and the DMG beam sweep feedback frame are reinterpreted.

In this embodiment of this application, the entire SLS process may include a plurality of rounds of the foregoing four stages. After a round of the foregoing four stages, training in the BRP 1104 may be started. Beam training in the BRP 1104 is different from beam training in the SLS 1103, and may be implemented by using a BRP packet including a data field with a suffix training field (Training field, TRN). The BRP packet may be receive beam refinement (BRP-RX) 114 and beam refinement 115 in FIG. 1a.

In the embodiments of this application, "first, second, and third" are merely used for differentiation, and constitute no actual limitation, for example, "first, second, and third" in a first sector sweep packet, a second sector sweep packet, a first to-be-fed-back beam, a second to-be-fed-back beam, a third to-be-fed-back beam, a first beam, and a second beam in the embodiments of this application.

Figure 2:
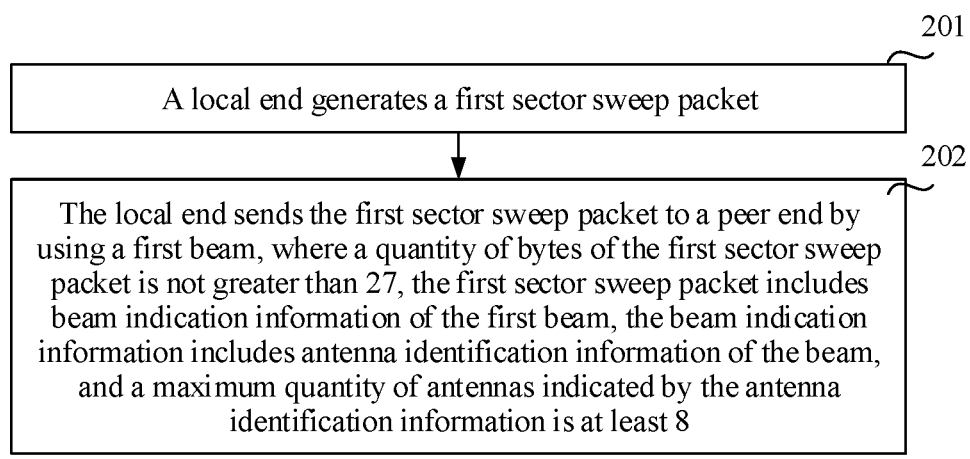
FIG. 2 is a schematic flowchart of a sector level sweep method according to an embodiment of this application.

For example, FIG. 2 is a schematic flowchart of a sector level sweep method according to an embodiment of this application. As shown in FIG. 2, the method includes the following steps.

Step 201: A local end generates a first sector sweep packet at a local end sector sweep stage. The local end in this embodiment of this application may be the initiator in FIG. 1a, or may be the responder in FIG. 1a. When the local end is the initiator, the local end sector sweep stage may also be referred to as the initiator sector sweep stage in FIG. 1a. When the local end is the responder, the local end sector sweep stage may also be referred to as the responder sector sweep stage in FIG. 1a.

Step 202: The local end sends the first sector sweep packet to a peer end by using a first beam. A quantity of bytes of the first sector sweep packet may be not greater than 27. Optionally, the first sector sweep packet includes beam indication information of the first beam. The beam indication information includes antenna identification information of the beam, and a maximum quantity of antennas indicated by the antenna identification information is at least 8.

Optionally, the first sector sweep packet may include an SSW frame and a short SSW packet. The SSW frame may include a directional multi-gigabit (directional multi-gigabit, DMG) SSW frame defined in the prior art, or may include an enhanced directional multi-gigabit (enhanced directional multi-gigabit, EDMG) SSW frame redefined in the embodiments of this application. The short SSW packet newly introduced in IEEE 802.11ay currently includes no MAC header, and therefore is referred to as the short SSW packet.

Because the sector sweep packet is sent when beams between devices are not aligned, a transmission manner with a relatively low rate is usually used, for example, DMG MCS 0 or DMG MCS 1. The DMG MCS 0 is a lowest transmission level, and therefore has a longest transmission latency under a constraint of a same physical layer service data unit (Physical Layer Service Data Unit, PSDU) length. In addition, a plurality of first sector sweep packets are usually transmitted at the local end sector sweep stage. Therefore, to reduce system overheads, a length of a PSDU of the first sector sweep packet needs to be properly selected in the transmission manner of the DMG MCS 0. Further, because a length that is of a PSDU of the first sector sweep packet and that is defined in IEEE 802.11ad is 26 bytes, the PSDU includes two LDPC code blocks according to a definition in the transmission format of the DMG MCS 0.

Specifically, a quantity of LDPC code blocks in the DMG MCS 0 may be calculated according to a formula (1):

$$Ncw=1+\text{ceil}((\text{length}-6)\times 8/168)) \qquad \text{formula (1)}$$

In the formula (1), Ncw is the quantity of LDPC code blocks, length is a quantity of bytes of the first sector sweep packet, and ceil is rounding-up.

In a first LDPC code block, in addition to a control header (control header), 6 bytes may be transmitted, and 88 bits in total may be transmitted. In remaining LDPC code blocks, a quantity of bits corresponding to an LDPC code block other than a last LDPC code block is calculated according to a formula (2), and a quantity of bits corresponding to the last LDPC code block is calculated according to a formula (3):

$$L_{DPCW}=\text{ceil}((\text{length}-6)\times 8/(Ncw-1)) \qquad \text{formula (2)}$$

In the formula (2), LDPCW is the quantity of bits corresponding to the LDPC code block other than the last LDPC code block, Ncw is the quantity of LDPC code blocks, length is the quantity of bytes of the first sector sweep packet, and ceil is rounding-up.

$$L_{last\ DPCW}=(\text{length}-6)\times 8-(Ncw-2)\times L_{DPCW} \qquad \text{formula (3)}$$

In the formula (3), $L_{last\ DPCW}$ is the quantity of bits corresponding to the last LDPC code block, LDPCW is the quantity of bits corresponding to the LDPC code block other than the last LDPC code block, Ncw is the quantity of LDPC code blocks, length is the quantity of bytes of the first sector sweep packet.

After LDPC coding and spectrum spreading are considered, an actual transmission sampling point may be calculated according to a formula (4):

$$CYD=((Ncw\times 168+\text{length}\times 8+40)\times 32) \qquad \text{formula (4)}$$

In the formula (4), CYD is the actual transmission sampling point obtained after the LDPC coding and the spectrum spreading, a sampling interval Tc=0.57 nanosecond, Ncw is the quantity of LDPC code blocks, and length is the quantity of bytes of the first sector sweep packet.

It can be learned from the foregoing analysis that, in the formula (4), the actual transmission sampling point obtained after the LDPC coding and the spectrum spreading is related to the quantity Ncw of LDPC code blocks and the quantity length of bytes of the first sector sweep packet. In the formula (4), a coefficient of Ncw is 168×32, and a coefficient of length is 8×32. If it is ensured that the quantity Ncw of LDPC code blocks is unchanged, and only the quantity length of bytes of the first sector sweep packet increases, an increase of the actual transmission sampling point CYD obtained after the LDPC coding and the spectrum spreading is relatively small, in other words, an increase of transmission overheads is relatively small.

It can be learned through analysis that, the first sector sweep packet includes the beam indication information of the first beam, the beam indication information includes the antenna identification information of the beam, and the maximum quantity of antennas indicated by the antenna identification information is at least 8. In other words, the first sector sweep packet can indicate at least eight antennas. In addition, current multi-antenna application scenarios include a scenario with eight data streams. Therefore, a quantity of antennas that can be indicated by the first sector sweep packet can meet a current multi-antenna requirement. In addition, for a throughput requirement, a quantity of streams that need to be supported may further increase, and therefore a quantity of antennas that need to be indicated is extended.

In addition, because the quantity of bytes of the first sector sweep packet is not greater than 27, it may be determined through the foregoing calculation that the quantity of LDPC code blocks corresponding to the first sector sweep packet is not greater than 2. In addition, the quantity of LDPC code blocks corresponding to the first sector sweep packet is not greater than 2, and a current protocol specifies that a sector sweep packet corresponds to two LDPC code blocks. In this embodiment of this application, although the quantity of antennas that can be indicated by the first sector sweep packet increases, the quantity of LDPC code blocks corresponding to the first sector sweep packet does not increase. Therefore, in this embodiment of this application, a transmission latency of the sector sweep packet does not excessively increase, and a relatively large increase of transmission overheads is not caused.

In this embodiment of this application, for sector sweep packets such as the first sector sweep packet and a second sector sweep packet, each sector sweep packet includes beam indication information of a beam for sending the sector sweep packet. For example, the first sector sweep packet includes the beam indication information of the first beam, and the second sector sweep packet includes beam indication information of a second beam.

Optionally, the beam indication information of the beam indicates antenna identification information of the beam. Specifically, the beam indication information indicates a specific antenna sending the beam. In the first sector sweep packet, if binary is used for representation, 3 bits are provided for the antenna identification information, and may indicate identification information of eight antennas.

Optionally, the beam indication information of the beam further includes beam identification information of the beam. In EDMG BRP training, a maximum quantity of antenna weight vectors (AWV, Antenna Weight Vector) that can be trained on each antenna has been extended to 2048. In the IEEE 802.11 ad standard, at a BRP stage, a quantity of beams that can be trained on each antenna is the same as a quantity of beams that can be trained through SLS. Therefore, in an EDMG SLS process, a quantity of beams that can be trained on each antenna may need to be extended to 2048. If binary is used for representation, 11 bits are provided for the beam identification information, and may indicate identification information of 2048 beams. Therefore, in the first sector sweep packet provided in this embodiment of this application, a maximum quantity of beams indicated by the beam identification information of the beam is at least 2048. In this way, in this embodiment of this application, a quantity of beams that is of a single antenna and that can be indicated also increases, and is consistent with that at the BRP stage.

Optionally, for each of the local end sector sweep stage and a peer end sector sweep stage, a total quantity of sector sweep packets sent at each stage may be indicated by using countdown identification information at the sector sweep stage. Optionally, in SLS, the local end and the peer end send U first sector sweep packets by sending beams of a sector level, where U is an integer greater than or equal to 1. At the local end sector sweep stage, U may be indicated by using countdown identification information (CDOWN) in the first sector sweep packet. Optionally, the beam indication information of the beam further includes countdown identification information corresponding to the beam at the local end sector sweep stage, and a maximum quantity of beams indicated by the countdown identification information of the beam is at least 16384.

For example, one antenna may have 2048 beams. If there are eight antennas in total, there are 16384 beams at the entire local end sector sweep stage. If binary is used for representation, 14 bits are provided for countdown identification information, and may indicate 16384 beams. In this way, in this embodiment of this application, a quantity of beams that can be indicated at the entire local end sector sweep stage also increases.

In an optional implementation solution, the quantity of bytes of the first sector sweep packet is still 26. In this embodiment of this application, this may be implemented by redefining some fields in a DMG SSW frame in an existing protocol.

Table 1 shows a format of an existing DMG SSW frame. As shown in Table 1, a sector sweep field occupies 3 bytes. A sector sweep feedback field occupies 3 bytes. Table 2 shows a format of an SSW field in an existing DMG SSW frame. Table 3 shows a format of an SSW feedback field in an existing DMG SSW frame in ISS. Table 4 shows a format of an SSW feedback field in an existing DMG SSW frame in RSS.

TABLE 1

| | Format of an existing DMG SSW frame | | | | | | |
|---|---|---|---|---|---|---|---|
| Field | Frame control (Frame control) | Duration (Duration) | Receiver address (Receiver Address, RA) | Transmitter address (Transmitter Address, TA) | Sector sweep field (SSW field) | Sector sweep feedback field (SSW feedback field) | Frame check sequence (Frame Check Sequence, FCS) |
| Quantity of occupied bytes | 2 | 2 | 6 | 6 | 3 | 3 | 4 |

TABLE 2

| | Format of an SSW field in an existing DMG SSW frame | | | | |
|---|---|---|---|---|---|
| Subfield | Direction (Direction) | Countdown identification information (CDOWN) | Beam identification information (Sector ID) | Antenna identification information (DMG Antenna ID) | Receive sector sweep length (RXSS Length) |
| Bit quantity | 1 | 9 | 6 | 2 | 6 |

TABLE 3

| | Format of an SSW feedback field in an existing DMG SSW frame in ISS | | | | |
|---|---|---|---|---|---|
| Subfield | Total quantity of beams in ISS (Total Sectors in ISS) | Receive DMG antenna quantity (Number of RX DMG Antennas) | Reserved bit (Reserved) | Poll request (Poll Request) | Reserved bit (Reserved) |
| Bit quantity | 9 | 2 | 5 | 1 | 7 |

TABLE 4

| | Format of an SSW feedback field in an existing DMG SSW frame in RSS | | | | |
|---|---|---|---|---|---|
| Subfield | Beam identification information of a to-be-fed-back beam (Sector Select) | Antenna identification information of a to-be-fed-back beam (DMG Antenna Select) | Reserved bit (Reserved) | Poll request (Poll Request) | Reserved bit (Reserved) |
| Bit quantity | 6 | 2 | 8 | 1 | 7 |

Binary is used for description in all embodiments of this application. If another manner is used, corresponding conversion may be performed. It can be learned from the foregoing content that, in the current DMG SSW frame, a quantity of antennas that can be indicated is only 2, the beam identification information occupies only 6 bits, and the countdown identification information occupies only 9 bits, which are far less than a requirement of quantity extension of each antenna sector in current antenna quantity extension.

The SSW frame includes the SSW field and the SSW feedback field. Based on Table 1 to Table 4, it can be learned that if a quantity of antennas needs to be extended to 8, and each antenna supports 2048 sectors, the countdown identification information that originally occupies 9 bits in Table 2 requires 5 additional bits, the antenna identification information requires 1 additional bit, and the beam identification information requires 5 additional bits. Therefore, 11 bits in total are further required. This embodiment of this application provides a solution, to redefine some fields in the current DMG SSW frame when a quantity of bytes in the current DMG SSW frame does not increase and is still 26. In this way, when the quantity of antennas that can be indicated by the first sector sweep packet increases, a length of the DMG SSW frame does not increase.

Specifically, optionally, that a local end generates a first sector sweep packet includes: adding, by the local end, the beam indication information of the first beam to a beam indication information field in the first sector sweep packet, to generate the first sector sweep packet, where the beam indication information field includes an extended beam indication information field, a beam indication information field of a DMG SSW frame, and a first indication information field. If the quantity of bytes of the sector sweep packet at the local end sector sweep stage is not greater than 26, for example, is 26, the first indication information field is used to define any one or more of a receive sector sweep length field in an SSW field in the DMG SSW frame, a signal-to-noise ratio report field in an SSW feedback field, and a reserved bit field as the extended beam indication information field. The receive sector sweep length field may also be referred to as an RXSS length field in the DMG SSW frame. The signal-to-noise ratio report field may also be referred to as an SNR report field in the DMG SSW frame. The reserved bit field may also be referred to as a reserved field in the DMG SSW frame. The beam indication information field of the DMG SSW frame may be any one or more fields in the antenna identification information (DMG Antenna ID), the beam identification information (Sector ID), and the countdown identification information (CDOWN) in Table 2. An English full name of ID is identification.

In this embodiment of this application, to meet a requirement, at least 12 bits are required. Although the receive sector sweep length RXSS length field in the SSW field in the DMG SSW frame can be reinterpreted, there are only 6 bits, which are insufficient for direct extension of the SSW field. Table 5 is a schematic table of a format of an SSW field in a possible DMG SSW frame. Table 6 is a schematic table of a format of an SSW feedback field in a possible DMG SSW frame in RSS. As shown in Table 5 and Table 6, the extended beam indication information field is not newly added, but some fields in the DMG SSW frame are reused.

For example, the extended beam indication information field may include 5 bits in extended countdown identification information and 1 bit in extended antenna identification information in Table 5, and 5 bits in extended beam identification information in Table 6. As shown in Table 6, 8 bits in an SNR report field in the SSW feedback field and 7 bits in a reserved field are further used. Some bits may be saved and used to indicate beam indication information of an extended to-be-fed-back beam and antenna identification information of the extended to-be-fed-back beam. Beam identification information of a to-be-fed-back beam is extended to 11 bits in total by using 6 bits in to-be-fed-back beam identification information (Sector Select) and 5 bits in beam identification information of an extended to-be-fed-back beam (Sector Select MSB) in Table 6. Antenna identification information of the to-be-fed-back beam is extended to 3 bits in total by using 6 bits in to-be-fed-back DMG antenna identification information (DMG Antenna Select) and 1 bit in DMG antenna identification information of the extended to-be-fed-back beam (DMG Antenna Select MSB) in Table 6. Further, optionally, to differentiate between a conventional DMG SSW frame (for example, the DMG SSW frame in Table 1 to Table 4) and the first sector sweep packet for which some fields are reinterpreted in this embodiment of this application, a first indication information field of 1 bit may be additionally added, and the first indication information field is used to indicate a type of the frame. The first indication information field may be represented as an EDMG extension flag bit (EDMG Extension Flag) in Table 6. When the first indication information field is 1, it indicates that an SSW field is included in a DMG SSW feedback frame or a DMG SSW acknowledgement frame, and is used for feedback to a short SSW packet. Because countdown identification information is extended to 11 bits by using the short SSW packet, whether the beam identification information of the extended to-be-fed-back beam (Sector Select MSB) needs to be extended is indicated by using this indicator bit. An English full name of MSB is most significant bit. Herein, when the EDMG extension flag bit (EDMG SSW Extension Flag) is 1, it indicates that the signal-to-noise ratio report field (SNR Report field) is used to indicate extension in the SSW field, for example, the extended beam identification information (Sector ID MSB). Correspondingly, if the DMG antenna identification information field (DMG Antenna ID field) is extended by using the extended antenna identification information (DMG Antenna ID MSB) field, the DMG antenna identification information (DMG Antenna Select) for feeding back some to-be-fed-back beams also needs to be extended. A direction (Direction) field in Table 5 indicates whether the frame is at an ISS stage or an RSS stage, and may also indirectly indicate whether the beam sweep frame carries information about a feedback field. In practice, an RXSS length field cannot be widely used. Because the local end cannot completely determine a length of RXSS, the length of the RXSS needs to be determined through negotiation between the local end and the peer end. Therefore, this field is reinterpreted in this application. In addition, at the RSS stage, a signal-to-noise ratio report is not necessary. Because a subsequent acknowledgement frame and feedback frame also carry the information, this field is reinterpreted in this application.

TABLE 5

Schematic table of a format of a reinterpreted SSW field in a DMG SSW frame

| Subfield | Direction (Direction) | Countdown (CDOWN) | Sector identification (Sector ID) | DMG antenna identification (DMG Antenna ID) | Extended countdown identification information (Extended CDOWN MSB) | Extended antenna identification information (DMG Antenna ID MSB) |
|---|---|---|---|---|---|---|
| Bit quantity | 1 | 9 | 6 | 2 | 5 | 1 |

TABLE 6

Schematic table of a format of a reinterpreted SSW feedback field in a possible DMG SSW frame in RSS

| Subfield | Beam identification information of a to-be-fed-back beam (Sector Select) | DMG antenna identification information of a to-be-fed-back beam (DMG Antenna Select) | Extended beam identification information (Sector ID MSB) | DMG antenna identification information of an extended to-be-fed-back beam (DMG Antenna Select MSB) | Reserved bit (Reserved) | Poll request (Poll Request) | Beam indication information of an extended to-be-fed-back beam (Sector Select MSB) | EDMG SSW extension indication (EDMG SSW Extension Flag) | EDMG extension flag bit (EDMG Extension Flag) |
|---|---|---|---|---|---|---|---|---|---|
| Bit quantity | 6 | 2 | 5 | 1 | 2 | 1 | 5 | 1 | 1 |

To meet a multi-antenna application scenario, another embodiment is provided in the embodiments of this application. In this embodiment, an SSW frame may be redefined. In this embodiment of this application, the redefined SSW frame is referred to as an EDMG SSW frame. The EDMG SSW frame belongs to the above described sector sweep packet in the first sector sweep packet and the second sector sweep packet. The EDMG SSW frame has 27 bytes. Compared with the DMG SSW frame, the EDMG SSW frame has one more byte. According to the transmission format definition of the DMG MCS 0, the EDMG SSW frame corresponds to two LDPC code blocks. In this case, one single carrier block is added to a length of an entire physical frame, and overheads of an entire system increase by 1%. However, a benefit of extensibility may be brought, so that the system may be extended more easily.

In the EDMG SSW frame, first 6 bytes and a non-EDMG control header (NON-EDMG control Header) are transmitted together. 88 bits in total are transmitted in a first LDPC code block. Data of 168 information bits is transmitted in a second LDPC block. According to an LDPC coding matrix, 168 check bits are obtained. The 88 bits and the 168 information bits and the 168 check bits form 256 bits or 336 bits. Differential binary phase shift keying (differential binary phase shift keying, DBPSK) modulation is performed on the 256-bit LDPC code block and the 336-bit LDPC code block, and 32-multiple spectrum spreading is performed. In this way, (2×168+27×8+40)×32 sampling points in total are obtained. x represents multiplication.

In this solution, an existing frame type of a frame needs to be extended. In a possible extension method, a subtype value field in a frame control (frame control) field is used to indicate a subtype value (Subtype value), and a reserved state in the frame control field is used to indicate a new beam sweep frame type. The new beam sweep frame type is referred to as an EDMG SSW frame type herein, and is not limited to this name.

In this embodiment of this application, the EDMG SSW frame having 27 bytes includes an extended SSW field or an extended SSW feedback field that replaces the SSW field or the SSW feedback field in the existing DMG SSW frame. Other fields are the same as those in Table 1. In a possible implementation solution, the extended SSW field (Extended SSW field) is directly added up to 4 bytes to support eight antennas. Each antenna has a maximum of 2048 sectors. That each ISS stage or RSS stage includes 8×2048 sweep packets is used as an example. For example, Table 7 is a schematic table of a format of an extended SSW field in an EDMG SSW frame. As shown in Table. 7, the EDMG SSW frame is also the first sector sweep packet and the second sector sweep packet, and the sector sweep packet directly includes countdown identification information having 14 bits, where the countdown identification information may be represented by using an extended countdown identification (Extended CDOWN) field in Table 7; includes antenna identification information having 3 bits, where the antenna identification information may be represented by using a DMG antenna identification (DMG Antenna ID) in Table 7; and includes beam identification information having 11 bits, where the beam identification information may be represented by using an extended beam identification (Extended Sector ID) in Table 7. For example, Table 8 is a schematic table of a format of an extended SSW feedback field in an EDMG SSW frame. As shown in Table 8, optionally, bits of beam identification information of a to-be-fed-back beam are extended to 11 bits in total, and bits of antenna identification information of the to-be-fed-back beam are extended to a total of 3 bits. A sector identification of a selected optimal sector, a corresponding antenna identification, and other fields are separately represented, and have 3 bytes in total.

TABLE 7

Schematic table of a format of an extended SSW field in an EDMG SSW frame

| Subfield | Direction (Direction) | Extended countdown identification (Extended CDOWN) | DMG antenna identification (DMG Antenna ID) | Extended beam identification (Extened Sector ID) | Reserved bit (Reserved) |
|---|---|---|---|---|---|
| Bit quantity | 1 | 14 | 3 | 11 | 3 |

TABLE 8

Schematic table of a format of an extended SSW feedback field in an EDMG SSW frame

| Subfield | Beam identification information of a to-be-fed-back beam (Sector Select) | DMG antenna identification of a to-be-fed-back beam (DMG Antenna Select) | Signal-to-noise ratio report field (SNR Report) | DMG poll request (Poll Request DMG) | Reserved bit (Reserved) |
|---|---|---|---|---|---|
| Bit quantity | 11 | 3 | 8 | 1 | 1 |

In this type of solutions shown in Table 7 and Table 8, the bits of the countdown identification information and the bits of the antenna identification information are extended. If the extension is excessive, a transmission latency increases. Therefore, in the DMG MCS 0, to keep a quantity of included LDPC code blocks the same as that in a DMG SSW frame, only 8 bits can be extended. Because a quantity of bits of the countdown identification information is not less than a sum of a quantity of bits of the antenna identification information and a quantity of bits of the beam identification information, a global optimal beam identification may be obtained after a round of an ISS stage, an RSS stage, a transmission stage of a sector sweep feedback frame, and a transmission stage of a sector sweep acknowledgement frame. In addition, because the countdown identification information and the extended antenna identification information are two parameters, a quantity of frames in entire ISS or RSS may be determined.

Based on the foregoing content, optionally, the first sector sweep packet or the second sector sweep packet in this embodiment of this application further includes the SSW feedback field, which is used to feed back preferred beam indication information at a previous stage, as shown in Table 8. Bits of the beam identification information of the to-be-fed-back beam (Sector Select) are extended to 11 bits in total, and bits of the antenna identification information of the to-be-fed-back beam (DMG Antenna Select) are extended to 3 bits in total. Optionally, before the local end generates the sector sweep packet, the method further includes: receiving, by the local end, the second sector sweep packet by using the second beam at a previous peer end sector sweep stage adjacent to the local end sector sweep stage. In other words, in this embodiment of this application, the local end sector sweep stage and the peer end sector sweep stage are adjacent to each other. In other words, if a sector sweep stage still exists after a local end sector sweep stage, the sector sweep stage is necessarily a peer end sector sweep stage. Correspondingly, if a sector sweep stage still exists after a peer end sector sweep stage, the sector sweep stage is necessarily a local end sector sweep stage. It may also be understood that RSS necessarily exists after ISS in this embodiment of this application. Optionally, the local end sends one or more sector sweep packets at the local end sector sweep stage, and the peer end sends one or more sector sweep packets at the peer end sector sweep stage.

Optionally, a sector sweep packet sent by the peer end at the previous peer end sector sweep stage adjacent to the local end sector sweep stage is referred to as a second sector sweep packet. At this stage, the peer end sends one or more second sector sweep packets.

Optionally, the second sector sweep packet includes the beam indication information of the second beam, and a quantity of bytes of the second sector sweep packet is not greater than 27. When the DMG MCS 0 is used for transmission, a quantity of low-density parity-check LDPC code blocks corresponding to the second sector sweep packet is not greater than 2.

That a local end generates a first sector sweep packet includes: selecting, by the local end, to-be-fed-back beam indication information of each of at least one first to-be-fed-back beam from the sector sweep packet received at the previous peer end sector sweep stage adjacent to the local end sector sweep stage; and generating, by the local end, the first sector sweep packet based on the to-be-fed-back beam indication information of each of the at least one first to-be-fed-back beam and the beam indication information of the first beam, where the to-be-fed-back beam indication information includes beam identification information of the to-be-fed-back beam, and a maximum quantity of beams indicated by the beam identification information of the to-be-fed-back beam is at least 2048. If binary is used for representation, 11 bits are provided for the beam identification information of the to-be-fed-back beam, and may indicate beam identification information of 2048 to-be-fed-back beams. For a specific implementation, refer to the foregoing description, for example, Table 6 or Table 8 in the foregoing content.

In an optional implementation solution, optionally, the to-be-fed-back beam indication information further includes antenna identification information of the to-be-fed-back beam, and a maximum quantity of antennas indicated by the antenna identification information of the to-be-fed-back beam is at least 8. If binary is used for representation, 3 bits are provided for the antenna identification information of the to-be-fed-back beam, and may indicate antenna identification information of eight to-be-fed-back beams. For a specific implementation, refer to the foregoing description, for example, Table 6 or Table 8 in the foregoing content.

Optionally, the first sector sweep packet includes 27 bytes, and the local end selects at least two first to-be-fed-back beams from the sector sweep packet received at the previous peer end sector sweep stage adjacent to the local end sector sweep stage. For example, Table 9 is a schematic table of a format of an extended SSW feedback field in an EDMG SSW frame.

TABLE 9

Schematic table of a format of an extended SSW feedback field in an EDMG SSW frame

| Subfield | Beam identification information of a to-be-fed-back beam (Sector Select) | Beam identification information of a to-be-fed-back beam (Sector Select) | Poll request (Poll Request) | Additional SLS indicator bit (Additional SLS) |
|---|---|---|---|---|
| Bit quantity | 11 | 11 | 1 | 1 |

TABLE 10

Schematic table of a format of an extended SSW field in an EDMG SSW frame

| Subfield | Direction (Direction) | DMG antenna identification (DMG Antenna ID) | Extended beam identification information (Extened Sector ID) | Reserved bit (Reserved) |
|---|---|---|---|---|
| Bit quantity | 1 | 3 | 11 | 1 |

TABLE 11

Schematic table of a format of an extended SSW feedback field in an EDMG SSW frame

| Subfield | Beam identification information of a to-be-fed-back beam (Sector Select) | Signal-to-noise ratio report SNR report | Beam identification information of a to-be-fed-back beam (Sector Select) | Signal-to-noise ratio SNR report | Poll request (Poll Request) | Additional SLS indicator bit (Additional SLS) |
|---|---|---|---|---|---|---|
| Bit quantity | 11 | 8 | 11 | 8 | 1 | 1 |

In another optional implementation solution, optionally, the to-be-fed-back beam indication information includes no antenna identification information of the to-be-fed-back beam. Specifically, optionally, the first sector sweep packet includes 27 bytes. At each of the local end sector sweep stage and the previous peer end sector sweep stage adjacent to the local end sector sweep stage, all sector sweep packets at the stage are sent by using beams in a same antenna direction. In addition, the local end selects at least two first to-be-fed-back beams from the sector sweep packet received at the previous peer end sector sweep stage adjacent to the local end sector sweep stage. Because all the sector sweep packets at the stage are sent by using the beams in the same antenna direction, the to-be-fed-back beam indication information does not need to include antenna identification information of the to-be-fed-back beam. In this way, a bit corresponding to the antenna identification information of the to-be-fed-back beam can be saved. Further, a plurality of to-be-fed-back beams such as an optimal beam and a suboptimal beam on the antenna may be fed back. In other words, the bit saved in the solution provided in this embodiment of this application is used to transmit more to-be-fed-back beams.

Further, in a solution in which another EDMG SSW frame having 27 bytes is provided, an extended SSW field or an extended SSW feedback field is included, and replaces the SSW field or the SSW feedback field in the existing DMG SSW frame. Other fields are the same as those in Table 1. The SSW field and the SSW feedback field in the existing DMG SSW frame are extended. A field having an SSW field function may be referred to as an extended SSW field, and is compressed to 2 bytes. A field having an SSW feedback field function may be referred to as an extended SSW feedback field, and is set to 5 bytes. A specific name is not limited.

As shown in Table 10, in this method, because the extended SSW field is compressed, 11 bits in extended beam identification information (Extended Sector ID) may be used to represent a quantity of sector sweep frames in an entire sector sweep stage, namely, countdown identification information in a DMG SSW frame, and represent beam identification information of a current beam. The sector sweep stage may be a local end sector sweep stage or a peer end sector sweep stage. In this way, in Table 11, a plurality of to-be-fed-back beams, for example, an optimal beam and a suboptimal beam on the antenna, may be fed back by using beam identification information of two to-be-fed-back beams. Further, signal-to-noise ratio report (SNR Report) information of the plurality of to-be-fed-back beams may be fed back. Content in a beam identification information (Sector Select) field of the to-be-fed-back beam indicates an identification of a selected optimal sector and an identification of a selected suboptimal sector.

In this method, because a function of the countdown identification information and a function of the beam identification information are combined, sectors of all antennas at a current ISS stage or RSS stage are identified in a unified manner. To be specific, if a receive end feeds back the countdown identification information, an end sending the beam may learn of an antenna and a sector that correspond to the countdown identification information. Certainly, the end receiving the beam still needs to learn of antenna identification information of the transmit beam. The receive end needs to learn whether a plurality of optimal sectors belong to different antennas or a same antenna, so as to subsequently initiate multi-antenna feedback. In other words, a bit saved in this solution provided in this embodiment of this application is used to transmit more to-be-fed-back beams.

Figure 2A:
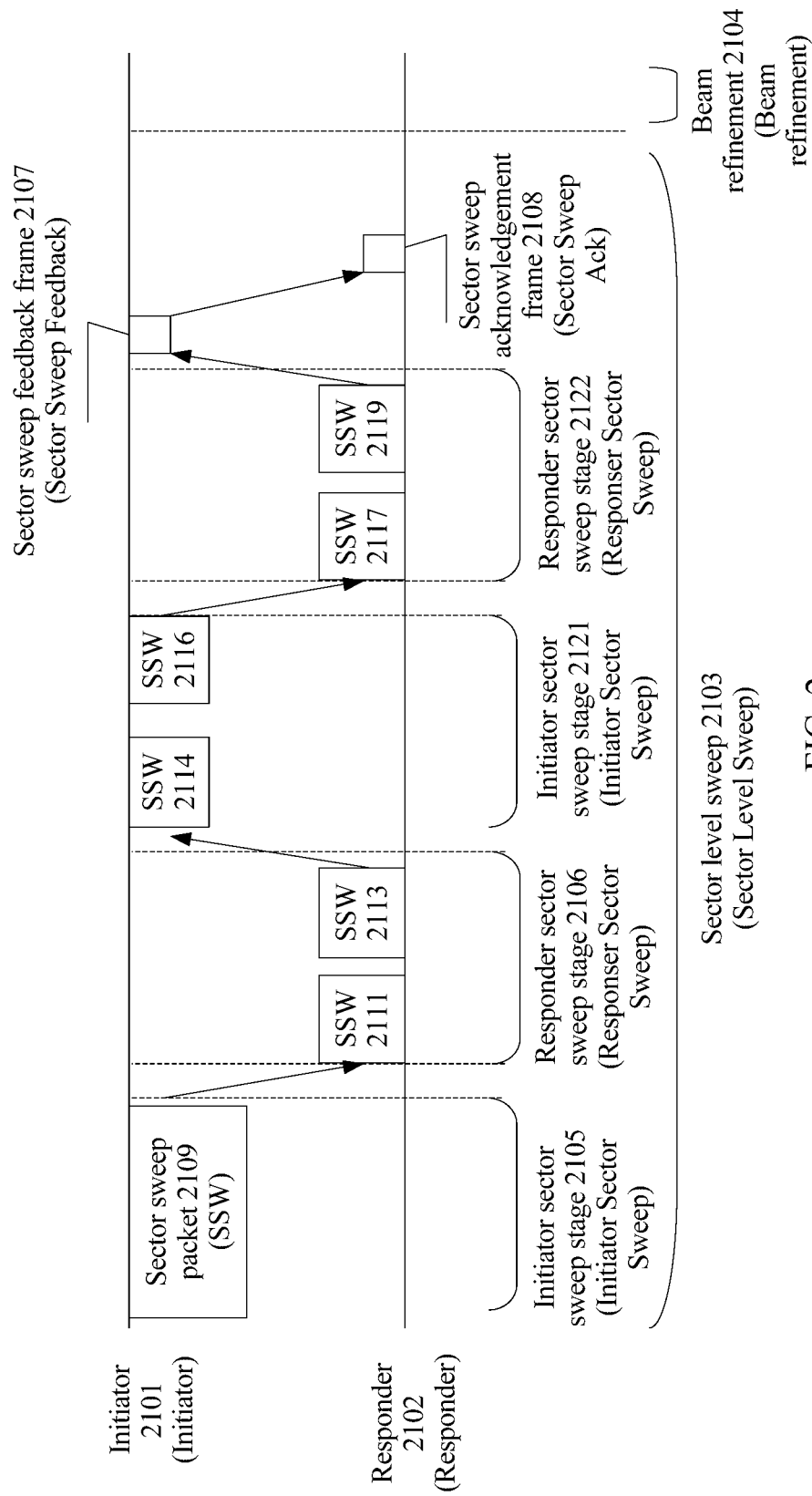
FIG. 2*a* is a schematic diagram of an SLS training procedure according to an embodiment of this application.

In addition, because the countdown identification information herein is the same as a maximum quantity of sectors of each antenna, sectors of all antennas of a device may not be trained at one ISS stage or one RSS stage. Only a maximum of 2048 sectors can be trained. Further, this embodiment of this application provides another optional implementation solution based on the solution shown in FIG. 1a. For example, FIG. 2a is a schematic diagram of a beam training procedure according to an embodiment of this application. As shown in FIG. 2a, optionally, entire SLS may be divided into a plurality of segments. Optionally, a beam of one transmit antenna or beams of a plurality of transmit antennas may be trained in each segment of ISS or RSS.

Optionally, after the local end sends the first sector sweep packet to a peer end by using a first beam, the method further includes: receiving, by the local end, a third sector sweep packet by using a third beam at a subsequent peer end sector sweep stage adjacent to the local end sector sweep stage, where the third sector sweep packet includes to-be-fed-back beam indication information that is of a second to-be-fed-back beam and that is selected by the peer end from the sector sweep packet received at the local end sector sweep stage.

Optionally, the first sector sweep packet further includes indication information used to indicate whether a local end sector sweep stage next to the local end sector sweep stage exists. For example, the additional SLS indicator bit (Additional SLS) in Table 11 may have another name. In this way, the entire SLS stage is divided into a plurality of segments by mutually spaced ISS and RSS.

Figure 2B:
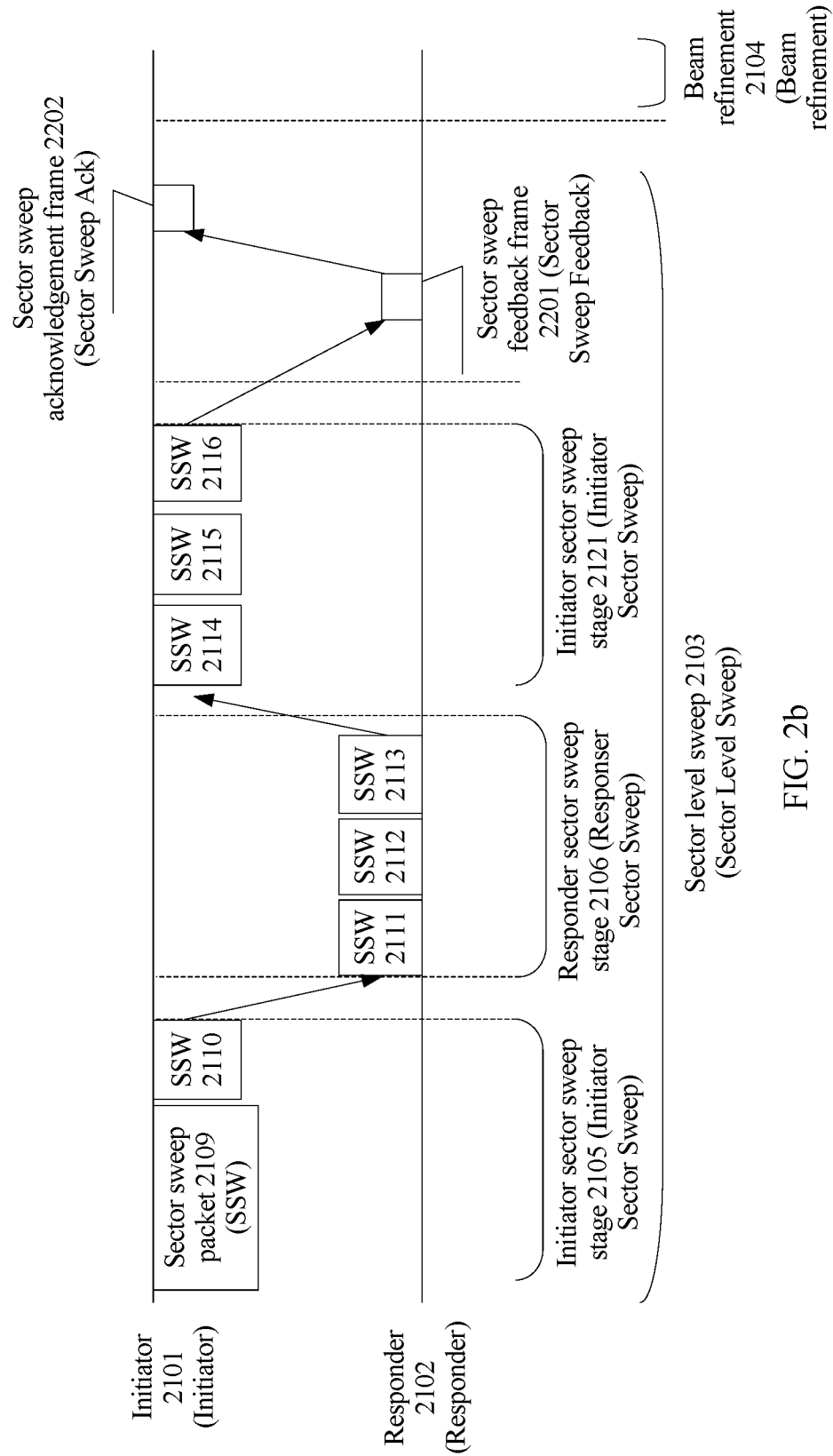
FIG. 2*b* is a schematic diagram of another beam training procedure according to an embodiment of this application.

For example, FIG. 2a and FIG. 2b are schematic diagrams of a beam training procedure according to an embodiment of this application. As shown in FIG. 2a and FIG. 2b, the beam training procedure includes two procedures: SLS 2103 and BRP 2104. The procedure SLS 2103 includes a plurality of sector sweep stages, a transmission stage of a sector sweep feedback frame 2107, and a transmission stage of a sector sweep acknowledgement frame 2108. In FIG. 2a and FIG. 2b, the local end may be a responder, and the peer end may be an initiator. Alternatively, in FIG. 2a and FIG. 2b, the local end may be an initiator, and the peer end may be a responder.

Optionally, the plurality of sector sweep stages include at least an ISS stage 2105, an RSS stage 2106, and an ISS stage 2121. In this case, at the RSS stage 2106, the initiator 2101 may receive a feedback result of the initiator 2101, and at the ISS stage 2121, the responder 2102 may also receive a feedback result of the responder 2102. In this way, the responder does not need to wait until the transmission stage of the sector sweep feedback frame 2107 and the transmission stage of the sector sweep acknowledgement frame 2108 to receive the feedback result of the responder. In other words, in this embodiment of this application, at least three mutually spaced sector sweep stages are included.

Further, as shown in FIG. 2a, a plurality of ISS stages and a plurality of RSS stages such as an RSS stage 2122 may be included. Beam training may be performed for the responder 2102 again at the RSS stage 2122 without waiting for a next SLS stage to perform next beam training, so that beam training efficiency can be improved. A total quantity of beams that can be trained by the device may be extended.

As shown in FIG. 2a, a plurality of SSW packets may be transmitted between the initiator (Initiator) 2101 and the responder (Responder) 2102 at the ISS stage 2105 and the RSS stage 2106. At the ISS stage 2105, the initiator 2101 sends a sector sweep packet such as SSW 2109 to the responder 2102, to perform transmit beam training or receive beam training of the initiator 2101. At the RSS stage 2106, the responder 2102 may send sector sweep packets such as SSW 2111 and SSW 2113, to perform transmit beam training or receive beam training of the responder 2102. At the ISS stage 2121, the initiator 2101 sends sector sweep packets such as SSW 2114 and SSW 2116 to the responder 2102, to perform transmit beam training or receive beam training of the initiator 2101. At the RSS stage 2122, the responder 2102 may send sector sweep packets such as SSW 2117 and SSW 2119, to perform transmit beam training or receive beam training of the responder 2102.

As shown in FIG. 2a, at the transmission stage of the sector sweep feedback (SSW Feedback) frame 2107, the beam sweep feedback (Sector Sweep Feedback) frame 2107 may be transmitted between the initiator 2101 and the responder 2102. At the transmission stage of the sector sweep acknowledgement (SSW Acknowledgement) frame 2108, the sector sweep acknowledgement (Sector Sweep Ack) frame 2108 may be transmitted between the initiator 2101 and the responder 2102. A result of the stages of the SLS 2103 may be determined by using the beam sweep feedback frame 2107 and the sector sweep acknowledgement frame 2108, and whether beam refinement needs to be performed is determined by using the beam sweep feedback frame 2107 and the sector sweep acknowledgement frame 2108.

As shown in FIG. 2b, a plurality of SSW packets may be transmitted between the initiator (Initiator) 2101 and the responder (Responder) 2102 at the ISS stage 2105 and the RSS stage 2106. At the ISS stage 2105, the initiator 2101 sends sector sweep packets such as SSW 2109 and SSW 2110 to the responder 2102, to perform transmit beam training or receive beam training of the initiator 2101. At the RSS stage 2106, the responder 2102 may send sector sweep packets such as SSW 2111, SSW 2112, and SSW 2113, to perform transmit beam training or receive beam training of the responder 2102. At the ISS stage 2121, the initiator 2101 sends sector sweep packets such as SSW 2114, SSW 2115, and SSW 2116 to the responder 2102, to perform transmit beam training or receive beam training of the initiator 2101.

As shown in FIG. 2b, at a transmission stage of a sector sweep feedback (SSW Feedback) frame 2201, the beam sweep feedback (Sector Sweep Feedback) frame 2201 may be transmitted between the initiator 2101 and the responder 2102. At a transmission stage of a sector sweep acknowledgement (SSW Acknowledgement) frame 2202, the sector sweep acknowledgement (Sector Sweep Ack) frame 2202 may be transmitted between the initiator 2101 and the responder 2102. A result of the stages of the SLS 2103 may be determined by using the beam sweep feedback frame 2201 and the sector sweep acknowledgement frame 2202, and whether beam refinement needs to be performed is determined by using the beam sweep feedback frame 2201 and the sector sweep acknowledgement frame 2202.

The entire SLS process may include a plurality of rounds of the foregoing plurality of sector sweep stages and other stages, and after a round of the SLS 2103, training in the BRP 2104 may be started, or another round of the SLS may be performed.

Further, as shown in FIG. 2b, based on the foregoing embodiment in which the plurality of sector sweep stages may be included, except that no measurement information is obtained in an SSW frame sent at the ISS 2105, at another sector sweep stage, regardless of the ISS stage or the RSS stage, a to-be-fed-back beam of a previous stage may be fed back, for example, the above mentioned optimal to-be-fed-back beam and suboptimal to-be-fed-back beam, or a feedback that carries an "increased antenna quantity" field or an "each antenna beam sweep feedback" field.

In FIG. 2a and FIG. 2b, it should be noted that there is no obvious difference between the ISS and the RSS, and in both the ISS and the RSS, a device transmits an SSW frame to perform beam training. However, because the initiator corresponds to a device that first performs beam training, ISS is earlier than RSS in each round of SLS. Therefore, a sweep frame sent in the RSS may carry a feedback result of sweep in the ISS. In a plurality of segments of ISS, because a second segment of ISS is later than a first segment of RSS, a sector sweep frame in the second segment of ISS may feed back beam training information measured in previous RSS. Therefore, a direction field in the sector sweep frame may be set to an RSS direction, to indicate that the measured beam training information needs to be carried. In this embodiment of this application, the local end may be the initiator or the responder in FIG. 2a and FIG. 2b, and the peer end may be the initiator or the responder in FIG. 2a and FIG. 2b.

Further, in an optional implementation solution, a short SSW packet is used at each sector sweep stage other than a first sector sweep stage. At the first sector sweep stage, the local end and the peer end, namely, a transmit end and a receive end, already can obtain a complete address. Therefore, at a second sector sweep stage, a short SSW packet may be used to perform beam training to send a sweep frame of another antenna. Because the short SSW packet occupies only one LDPC code block, efficiency is higher than that in a case in which a sector sweep frame occupying two LDPC code blocks is used in an entire SLS training process.

Because a range of an identification of a beam that can be trained by using the short SSW packet is 11 or 12 bits, a range of beam training in an SSW frame in a first round also needs to keep consistent. Therefore, at the first sector sweep stage, two methods of an extended beam identification may be selected for implementation. For example, a reserved field in an original SSW field is used and an SNR subfield in an SSW feedback field is reused, or an EDMG SSW frame including 27 bytes is used.

This embodiment of this application further provides a solution, used to determine a length of a sector sweep frame as one LDPC code block. Specifically, information in a short SSW packet (SSSW packet) in the 802.11ay standard may be changed. A length of an entire PSDU is compressed to 6 bytes through SSSW, and a fixed format of a medium access control header is removed. Therefore, the short SSW packet is no longer a MAC frame. The short SSW packet is shortened to one LDPC code block.

Table 12 is a schematic table of a format of a short SSW packet in the prior art. Table 13 is a schematic table of a format of an SSW feedback field in an SSW feedback frame when a short SSW packet is used for SLS currently.

TABLE 12

| | Format of a short SSW packet in the prior art | | | | | | | |
|---|---|---|---|---|---|---|---|---|
| Field | Short SSW packet type (Packet type) | Direction (Direction) | Reserved bit (Reserved) | Source address (Source AID) | Destination address (Destination AID) | Countdown identification information (CDOWN) | Antenna identification information (RF Chain ID) | SSW feedback field (Short SSW Feedback) | Frame check sequence (FCS) |
| Bit quantity | 2 | 1 | 1 | 8 | 8 | 11 | 2 | 11 | 4 |

TABLE 13

| | Format of an SSW feedback field in a DMG SSW feedback frame or a DMG SSW acknowledgement frame when a short SSW packet is used for SLS in the prior art | | | | | | |
|---|---|---|---|---|---|---|---|
| Subfield | Beam identification information of a to-be-fed-back beam (Sector Select) | DMG antenna identification information of a to-be-fed-back beam (DMG Antenna Select) | Signal-to-noise ratio report (SNR Report) | DMG poll request (Poll Request DMG) | Beam identification information of an extended to-be-fed-back beam (Sector Select MSB) | Reserved bit (Reserved) | EDMG extension flag bit (EDMG Extension Flag) |
| Bit quantity | 6 | 2 | 8 | 1 | 5 | 1 | 1 |

It can be learned from the foregoing content that, antenna identification information in the short SSW packet in the prior art may be indicated by using a DMG antenna identification information (DMG Antenna Select) field of a to-be-fed-back beam, and only two antennas can be indicated. Countdown identification information and beam identification information are indicated by using the countdown identification information (CDOWN), and only 11 bits are occupied. Therefore, identification information of a beam that can be trained on each antenna occupies only 9 bits.

This embodiment of this application provides an optional solution. If each of the first sector sweep packet and the second sector sweep packet is a short SSW packet, information about a physical layer service data unit length field in the short SSW packet is 6, and a quantity of antennas that can be swept or a quantity of sectors that can be swept is extended. In this embodiment, both the first sector sweep packet and the second sector sweep packet include the short SSW packet. The physical layer service data unit length field may also be represented as a PSDU length field.

All other PSDUs include a complete MAC header, and fixed overheads of a MAC packet are 12 or 20 bytes. If a PSDU length indication in an L-header legacy header is 6, it may indicate that the packet is a short SSW packet. A type of the short SSW packet is indicated by using a PSDU length field in the short SSW packet. Therefore, 2 bits of the short SSW packet type (Packet type) in Table 12 can be saved. The 2 bits of the short SSW packet type (Packet type) may also be used to indicate the foregoing indication information used to indicate whether a local end sector sweep stage next to the local end sector sweep stage exists. The indication information may also be referred to as additional SLS in English, or may have another name, and indicate extension of ISS or RSS.

Optionally, that the local end adds beam indication information at the local end sector sweep stage to the sector sweep packet at the local end sector sweep stage includes: adding, by the local end, the beam indication information at the local end sector sweep stage to a beam indication information field that is at the local end sector sweep stage and that is in the sector sweep packet at the local end sector sweep stage, where the beam indication information field at the local end sector sweep stage includes the beam indication information field at the local end sector sweep stage, a beam information indication field obtained after extension at the local end sector sweep stage, and a second indication information field, and the second indication information field is used to define any one or more of an FCS field, a packet type field, and a reserved field in the short SSW packet as the beam information indication field obtained after the extension at the local end sector sweep stage. A frame check sequence field may also be referred to as the FCS field in the short SSW packet. A packet type field may also be referred to as the packet type field in the short SSW packet. A reserved bit field may also be referred to as the reserved field in the short SSW packet.

Specifically, masks may be separately added to 4 bits of the FCS field by using a 1111 sequence and a 0000 sequence, and 1 bit may be represented. Further, a packet type may use a maximum of 2 bits, and the reserved field may represent 1 bit. Optionally, the radio frequency chain identification information (Radio Frequency Chain ID, RF Chain ID) in Table 12 may be extended to 3 bits, so that more antennas can be supported, and a current requirement on eight antennas is met. A function of the radio frequency chain identification herein is consistent with a function of the foregoing antenna identification information. Further, because both the countdown identification information (CDOWN) and the SSW feedback field (Short SSW Feedback) in Table 12 need to be extended, if the countdown identification information (CDOWN) is extended by 1 bit, the SSW feedback field (Short SSW Feedback) also needs to be extended by 1 bit. For example, Table 14 and Table 15 are schematic tables of a format of a short SSW packet in this embodiment of this application. As shown in Table 14, antenna identification information (RF Chain ID) is increased by 1 bit by adding a mask to 4 bits of the FCS, to extend a most significant bit of an antenna identification. As shown in Table 15, 2 bits can be saved by using a packet type, and both countdown identification information (CDOWN) and an SSW feedback field (Short SSW Feedback) need to be extended by 1 bit. Because a sequence of each field may be adjusted, there is no limitation herein.

TABLE 14

Schematic table of a format of a short SSW packet

| Field | Packet type (Packet type) | Extended RF chain identification (Extended RF Chain ID) | Direction (Direction) | Reserved bit (Reserved) | Source address (Source AID) | Destination address (Destination AID) | Countdown identification information (CDOWN) | RF chain identification (RF Chain ID) | Short SSW feedback Short SSW Feedback | Check bit FCS |
|---|---|---|---|---|---|---|---|---|---|---|
| Bit quantity | 1 | 1 | 1 | 1 | 8 | 8 | 11 | 2 | 11 | 4 |

TABLE 15

Schematic table of a format of a short SSW packet

| Field | Direction (Direction) | Reserved bit (Reserved) | Source address (Source AID) | Destination address (Destination AID) | Countdown identification information (CDOWN) | RF chain identification (RF Chain ID) | Short SSW feedback field (Short SSW Feedback) | Check bit (FCS) |
|---|---|---|---|---|---|---|---|---|
| Bit quantity | 1 | 1 | 8 | 8 | 12 | 2 | 12 | 4 |

Further, for the short SSW packet, because a CDOWN parameter cannot be independently changed in the short SSW packet, receive beam sweep cannot be performed. A feature of a receive beam sweep frame is that CDOWN countdown identification information progressively decreases, and a sector ID is a beam identification for transmitting the beam. A receive end performs receive beam training by changing the receive beam. Therefore, a type of a training field (Training field, TRN) is allowed to be set to a receive training (Receive training, TRN-R) field in an L-header (which is also referred to as a non-EDMG header, and indicates a format in a control mode). In other words, a TRN-len is set to a number greater than 1 through receive beam training. This can overcome a disadvantage that receive beam training cannot be performed in the short SSW packet.

Likewise, because countdown identification information in a short SSW frame is the same as a maximum quantity of sectors of each antenna, sectors of all antennas of the device may not be trained at one ISS stage or one RSS stage. Only a maximum of 2048 sectors can be trained in the procedure in FIG. 2a. A maximum quantity of sectors that support training may be extended in the procedures in FIG. 2a and FIG. 2b.

The foregoing content is intended for a sector sweep stage. The following also provides an optional implementation solution for a transmission stage of a sector sweep feedback frame and a transmission stage of a sector sweep acknowledgement frame. In this solution, after the local end sends the first sector sweep packet to a peer end by using a first beam, the method further includes: sending, by the local end, a sector sweep feedback frame to the peer end, and receiving, by the local end, a sector sweep acknowledgement frame sent by the peer end. Alternatively, after the local end sends the first sector sweep packet to a peer end by using a first beam, the method further includes: receiving, by the local end, a sector sweep feedback frame sent by the peer end, and sending, by the local end, a sector sweep acknowledgement frame to the peer end. In the foregoing two solutions, for each of the sector sweep feedback frame and the sector sweep acknowledgement frame, a quantity of occupied bytes is not greater than 48, and when MCS 0 is used for transmission, a quantity of occupied LDPC code blocks is not greater than 3. In this way, a quantity of beams that can be trained and a feedback quantity are extended without enlarging the sector sweep feedback frame and the sector sweep acknowledgement frame.

In this embodiment of this application, a field definition of the sector sweep feedback frame is the same as that of the sector sweep acknowledgement frame in terms of a format, but the sector sweep feedback frame is sent before the sector sweep acknowledgement frame, and content in previous sector sweep feedback frame may be acknowledged. Table 16 shows a format of a DMG SSW feedback frame or a DMG SSW ACK frame.

When an SSW feedback field keeps 3 bytes, the SSW feedback field is used in all embodiments. Specifically, both a training antenna quantity and a sector quantity can be extended through extension in Table 6 or Table 13.

For each of the sector sweep feedback frame and the sector sweep acknowledgement frame, as shown in Table 16, an existing sector sweep feedback frame and an existing sector sweep acknowledgement frame each have 28 bytes. It can be learned from the foregoing description that three LDPC code blocks are required to transmit each of the sector sweep feedback frame and the sector sweep acknowledgement frame. Therefore, this embodiment of this application provides a solution in which both a quantity of bytes of the sector sweep feedback frame and a quantity of bytes of the sector sweep acknowledgement frame are extended to 48 bytes. In this case, the sector sweep feedback frame and the sector sweep acknowledgement frame each still use only three LDPC code blocks, and an increased latency is far shorter than a latency caused by adding one LDPC code block. Specifically, the following calculation may reflect this beneficial effect. When both the sector sweep feedback frame and the sector sweep acknowledgement frame are increased to 48 bytes, both a second LDPC code block and a third LDPC code block are transmitted based on a maximum information bit quantity 168. In this case, transmission duration increases by 20×8×32×0.57 ns=2918.4 ns. Because a shortest interframe space, namely, short interframe space (Short Inter Frame Space), in each frame is 3 μs, an added length is less than the interframe space. Therefore, although a length of a physical packet is increased, a latency is shorter than that existent when another BRP packet is used for feedback.

Further, in this embodiment of this application, both the quantity of bytes of the sector sweep feedback frame and the quantity of bytes of the sector sweep acknowledgement frame are extended to 48 bytes. Therefore, optionally, each of the sector sweep feedback frame and the sector sweep acknowledgement frame includes at least two sector sweep feedback fields, and each of the at least two sector sweep feedback fields includes to-be-fed-back beam indication information of at least two third to-be-fed-back beams corresponding to a same antenna. The third to-be-fed-back beam is a beam corresponding to a sector sweep frame that belongs to same SLS as the sector sweep feedback frame and the sector sweep acknowledgement frame, for example, may be the first beam and/or the second beam described above.

For example, Table 17 is a schematic table of a format of a sector sweep feedback frame or a sector sweep acknowledgement frame according to an embodiment of this application. As shown in Table 17, the sector sweep feedback frame or the sector sweep acknowledgement frame may include four sector sweep feedback fields, for example, four SSW feedback fields in Table 17. Each SSW feedback field occupies 5 bytes. For example, Table 18 is a schematic table of a possible format of the sector sweep feedback field in

TABLE 16

Schematic table of a format of a DMG sector sweep feedback frame and a DMG sector sweep acknowledgement frame

| Field | Frame control (Frame control) | Duration (Duration) | Receiver address (RA) | Transmitter address (TA) | Sector sweep feedback field (SSW feedback) | Beam refinement protocol request (Beam Refinement Protocol Request, BRP Request) | Beamformed link maintenance (Beamformed Link maintenance) | Frame check sequence (FCS) |
|---|---|---|---|---|---|---|---|---|
| Byte | 2 | 2 | 6 | 6 | 3 | 4 | 1 | 4 |

Table 17, and Table 19 is a schematic table of another possible format of the sector sweep feedback field in Table 17. As shown in Table 18, in the sector sweep feedback frame or the sector sweep acknowledgement frame, a poll request (Poll Request) is used by a non-PCP/non-AP STA to indicate whether a personal basic service set control point (personal basic service set (PBSS) control point, PCP)/an AP is required to initiate communication. If the PCP/AP initiates the communication, this bit is reserved. Because an SSW feedback stage and an SSW Ack stage do not separately exist, and a poll request in previous ISS and RSS indicates a same request, the SSW feedback stage and the SSW Ack stage can be reused. In addition, because the SSW feedback stage and the SSW Ack stage are an end of the SLS, additional SLS is no longer meaningful, and may be reused. The additional SLS and 1 bit in reserved bits may be reinterpreted as an RF ID. In a possible implementation, 3 redundant bytes are used to extend a refinement protocol request (BRP Request), and are used for parameter negotiation at a BRP stage.

As shown in Table 19, the sector sweep feedback frame may feed back only beam indication information at a previous stage. In addition, if all beams at the previous stage are in a same direction, in this case, the sector sweep feedback frame does not need to feed back antenna identification information. Similarly, the sector sweep acknowledgement frame may feed back only beam indication information in a sector sweep feedback frame at a previous stage. In addition, if all beams in the sector sweep feedback frame are in a same direction, in this case, the sector sweep acknowledgement frame does not need to feed back antenna identification information.

Further, in this embodiment of this application, a subtype value field in frame control (frame control) field may be used to indicate a subtype value (Subtype value), and a reserved state in the frame control is used to indicate a type of the sector sweep feedback frame and the sector sweep acknowledgement frame after the extension.

TABLE 17

Schematic table of a format of a sector sweep feedback frame or a sector sweep acknowledgement frame

| Field | Frame control (Frame control) | Duration (Duration) | Receiver address (RA) | Transmitter address (TA) | Sector sweep feedback field (SSW feedback) | Sector sweep feedback field (SSW feedback) | Sector sweep feedback field (SSW feedback) | Sector sweep feedback field (SSW feedback) | Beam refinement protocol request (BRP Request) | Beamformed link maintenance (Beamformed Link maintenance) | Frame check sequence (FCS) |
|---|---|---|---|---|---|---|---|---|---|---|---|
| Byte | 2 | 2 | 6 | 6 | 5 | 5 | 5 | 5 | 7 | 1 | 4 |

TABLE 18

Schematic diagram of a format of the sector sweep feedback field in Table 17

| Subfield | Beam identification information of a to-be-fed-back beam (Sector Select) | Signal-to-noise ratio report (SNR Report) | Beam identification information of a to-be-fed-back beam (Sector Select) | Signal-to-noise ratio report (SNR Report) | Radio frequency identification information (Radio Frequency ID, RF ID) | Poll request (Poll Request) |
|---|---|---|---|---|---|---|
| Bit quantity | 11 | 8 | 11 | 8 | 3 | 1 |

TABLE 19

Schematic diagram of another format of the sector sweep feedback field in Table 17

| Subfield | Beam identification information of a to-be-fed-back beam (Sector Select) | Signal-to-noise ratio report (SNR Report) | Beam identification information of a to-be-fed-back beam (Sector Select) | Signal-to-noise ratio report (SNR Report) | Poll request (Poll Request) | Reserved bit (Reserved) |
|---|---|---|---|---|---|---|
| Bit quantity | 12 | 8 | 12 | 8 | 1 | 1 |

This embodiment of this application provides the foregoing solutions, and any combination of a plurality of solutions in the foregoing content in this embodiment of this application also falls within the protection scope of this application. In the foregoing method provided in this embodiment of this application, a quantity of antennas that can be indicated by the first sector sweep packet meets a requirement that a system supports eight data streams. In addition, a transmission latency of the sector sweep packet does not excessively increase.

Figure 3:
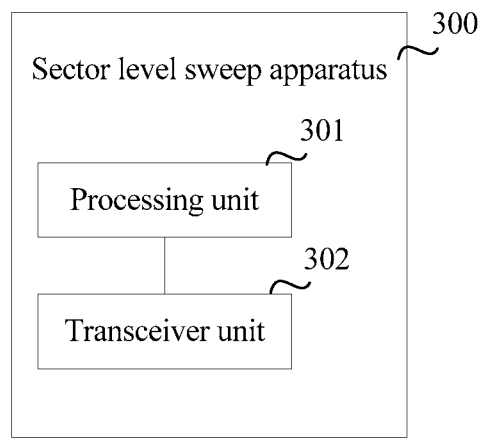
FIG. 3 is a schematic structural diagram of a sector level sweep apparatus according to an embodiment of this application.

For example, FIG. 3 is a schematic structural diagram of a sector level sweep apparatus according to an embodiment of this application.

Based on a same concept, an embodiment of this application provides a schematic structural diagram of a sector level sweep apparatus 300. As shown in FIG. 3, the sector level sweep apparatus 300 includes a processing unit 301 and a transceiver unit 302. Specifically, the sector level sweep apparatus may be the local end in the foregoing content, and specifically, may be an initiator or a responder.

The processing unit is configured to generate a first sector sweep packet at a local end sector sweep stage.

The transceiver unit is configured to send the first sector sweep packet to a peer end by using a first beam, where a quantity of bytes of the first sector sweep packet is not greater than 27, the first sector sweep packet includes beam indication information of the first beam, the beam indication information includes antenna identification information of the beam, and a maximum quantity of antennas indicated by the antenna identification information is at least 8.

In this embodiment of this application, optionally, the first sector sweep packet may include an SSW frame and a short SSW packet. The SSW frame may include a DMG SSW frame defined in the prior art, or may include an EDMG SSW frame redefined in the embodiments of this application. The short SSW packet newly introduced in IEEE 802.11ay currently includes no MAC header, and therefore is referred to as the short SSW packet.

It can be learned through analysis that, the first sector sweep packet includes the beam indication information of the first beam, the beam indication information includes the antenna identification information of the beam, and the maximum quantity of antennas indicated by the antenna identification information is at least 8. In other words, the first sector sweep packet can indicate at least eight antennas. In addition, current multi-antenna application scenarios include a scenario with eight data streams. Therefore, a quantity of antennas that can be indicated by the first sector sweep packet can meet a current multi-antenna requirement. In addition, for a throughput requirement, a quantity of streams that need to be supported may further increase, and therefore a quantity of antennas that need to be indicated is extended.

In addition, because the quantity of bytes of the first sector sweep packet is not greater than 27, it may be determined through the foregoing calculation that a quantity of LDPC code blocks corresponding to the first sector sweep packet is not greater than 2. In addition, the quantity of LDPC code blocks corresponding to the first sector sweep packet is not greater than 2, and a current protocol specifies that a sector sweep packet corresponds to two LDPC code blocks. In this embodiment of this application, although the quantity of antennas that can be indicated by the first sector sweep packet increases, the quantity of LDPC code blocks corresponding to the first sector sweep packet does not increase. Therefore, in this embodiment of this application, a transmission latency of the sector sweep packet does not excessively increase, and a relatively large increase of transmission overheads is not caused.

Optionally, the beam indication information of the beam further includes beam identification information of the beam. In EDMG BRP training, a maximum quantity of antenna weight vectors (AWV, Antenna Weight Vector) that can be trained on each antenna has been extended to 2048. Therefore, in the first sector sweep packet provided in this embodiment of this application, a maximum quantity of beams indicated by the beam identification information of the beam is at least 2048. In this way, in this embodiment of this application, a quantity of beams that is of a single antenna and that can be indicated also increases, and is consistent with that at a BRP stage.

Optionally, for each of the local end sector sweep stage and a peer end sector sweep stage, a total quantity of sector sweep packets sent at each stage may be indicated by using countdown identification information at the sector sweep stage. The beam indication information further includes countdown identification information corresponding to the beam at the local end sector sweep stage, and a maximum quantity of beams indicated by the countdown identification information of the beam is at least 16384. In this way, in this embodiment of this application, a quantity of beams that can be indicated at the entire local end sector sweep stage also increases.

In an optional implementation solution, the quantity of bytes of the first sector sweep packet is still 26. In this embodiment of this application, this may be implemented by redefining some fields in a DMG SSW frame in an existing protocol. Optionally, the processing unit is configured to add the beam indication information of the first beam to a beam indication information field in the first sector sweep packet, to generate the first sector sweep packet, where the beam indication information field includes an extended beam indication information field and a first indication information field, and if the sector sweep packet at the local end sector sweep stage has 26 bytes, the first indication information field is used to instruct to define any one or more of a receive sector sweep length field in an SSW field in a DMG SSW frame, a signal-to-noise ratio report field in an SSW feedback field, and a reserved bit field as the extended beam indication information field. In this way, when the quantity of antennas that can be indicated by the first sector sweep packet increases, a length of the DMG SSW frame does not increase.

Based on the foregoing content, optionally, the first sector sweep packet or a second sector sweep packet in this embodiment of this application further includes the SSW feedback field, which is used to feed back preferred beam indication information at a previous stage. Optionally, the transceiver unit is further configured to receive a second sector sweep packet by using a second beam at a previous peer end sector sweep stage adjacent to the local end sector sweep stage, where the second sector sweep packet includes beam indication information of the second beam, and a quantity of bytes of the second sector sweep packet is not greater than 27. The processing unit is configured to: select to-be-fed-back beam indication information of each of at least one first to-be-fed-back beam from the sector sweep packet received at the previous peer end sector sweep stage adjacent to the local end sector sweep stage, and generate the first sector sweep packet based on the to-be-fed-back beam indication information of each of the at least one first to-be-fed-back beam and the beam indication information of the first beam, where the to-be-fed-back beam indication information includes beam identification information of the to-be-fed-back beam, and a maximum quantity of beams indicated by the beam identification information of the to-be-fed-back beam is at least 2048.

In an optional implementation solution, optionally, the to-be-fed-back beam indication information further includes antenna identification information of the to-be-fed-back beam, and a maximum quantity of antennas indicated by the antenna identification information of the to-be-fed-back beam is at least 8. If binary is used for representation, 3 bits are provided for the antenna identification information of the to-be-fed-back beam, and may indicate antenna identification information of eight to-be-fed-back beams. For a specific implementation, refer to the foregoing description, for example, Table 6 or Table 8 in the foregoing content.

Optionally, the first sector sweep packet includes 27 bytes, and at least two first to-be-fed-back beams are selected from the sector sweep packet received at the previous peer end sector sweep stage adjacent to the local end sector sweep stage. In this way, a bit corresponding to the antenna identification information of the to-be-fed-back beam can be saved. Further, a plurality of to-be-fed-back beams such as an optimal beam and a suboptimal beam on the antenna may be fed back. In other words, the bit saved in the solution provided in this embodiment of this application is used to transmit more to-be-fed-back beams.

Optionally, the transceiver unit is further configured to: send a sector sweep feedback frame to the peer end, and receive a sector sweep acknowledgement frame sent by the peer end; or receive a sector sweep feedback frame sent by the peer end, and send a sector sweep acknowledgement frame to the peer end. For each of the sector sweep feedback frame and the sector sweep acknowledgement frame, a quantity of occupied bytes is not greater than 48, and a quantity of occupied LDPC code blocks is not greater than 3.

Optionally, each of the sector sweep feedback frame and the sector sweep acknowledgement frame includes at least two sector sweep feedback fields, and each of the at least two sector sweep feedback fields includes to-be-fed-back beam indication information of at least two third to-be-fed-back beams corresponding to a same antenna.

Optionally, the transceiver unit is further configured to receive a third sector sweep packet by using a third beam at a subsequent peer end sector sweep stage adjacent to the local end sector sweep stage, where the third sector sweep packet includes to-be-fed-back beam indication information that is of a second to-be-fed-back beam and that is selected by the peer end from the sector sweep packet received at the local end sector sweep stage.

Optionally, the first sector sweep packet further includes indication information used to indicate whether a local end sector sweep stage next to the local end sector sweep stage exists. For example, the additional SLS indicator bit (Additional SLS) in Table 11 may have another name. In this way, an entire SLS stage is divided into a plurality of segments by mutually spaced ISS and RSS.

Optionally, if the sector sweep packet is a short SSW packet, information about a physical layer service data unit length field in the short SSW packet is 6, and the processing unit is configured to add beam indication information at the local end sector sweep stage to a beam indication information field that is at the local end sector sweep stage and that is in the sector sweep packet at the local end sector sweep stage, where the beam indication information field at the local end sector sweep stage includes the beam indication information field at the local end sector sweep stage, a beam information indication field obtained after extension at the local end sector sweep stage, and a second indication information field, and the second indication information field is used to define any one or more of a frame check sequence field, a packet type field, and a reserved bit field in the short SSW packet as the beam information indication field obtained after the extension at the local end sector sweep stage. The frame check sequence field may also be referred to as an FCS field in the short SSW packet. The packet type field may also be referred to as a packet type field in the short SSW packet. The reserved bit field may also be referred to as a reserved field in the short SSW packet.

Figure 4:
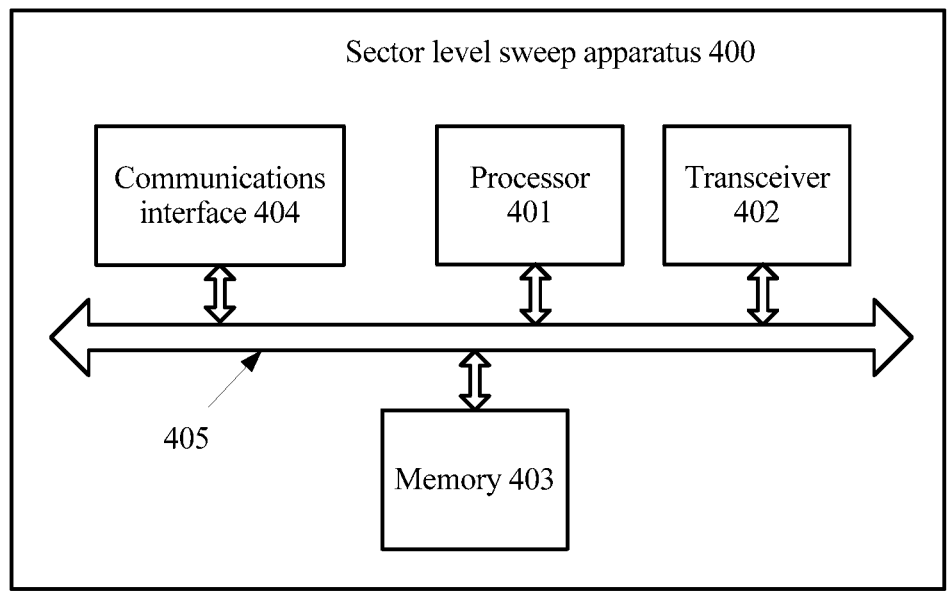
FIG. 4 is a schematic structural diagram of another sector level sweep apparatus according to an embodiment of this application.

It should be understood that division of the foregoing units is merely logical function division. In actual implementation, all or some of the units may be integrated into one physical entity, or may be physically separate. In this embodiment of this application, the transceiver unit 302 may be implemented by a transceiver, and the processing unit 301 may be implemented by a processor. As shown in FIG. 4, a sector level sweep apparatus 400 may include a processor 401, a transceiver 402, and a memory 403. The memory 403 may be configured to store a program/code pre-installed when the sector level sweep apparatus 400 is delivered from a factory, or may store code or the like executed by the processor 401.

For example, FIG. 4 is a schematic structural diagram of the sector level sweep apparatus according to this application.

Based on a same concept, this application provides the sector level sweep apparatus 400, configured to perform the foregoing method procedure. The sector level sweep apparatus 400 includes the processor 401, the transceiver 402, the memory 403, and a communications interface 404. The processor 401, the transceiver 402, the memory 403, and the communications interface 404 are connected to each other by using a bus 405.

The bus may be a peripheral component interconnect (peripheral component interconnect, PCI for short) bus, an extended industry standard architecture (extended industry standard architecture, EISA for short) bus, or the like. The bus may be classified into an address bus, a data bus, a control bus, and the like. For ease of representation, only one thick line is used to represent the bus in FIG. 4, but this does not mean that there is only one bus or only one type of bus.

The memory may include a volatile memory (volatile memory), such as a random-access memory (random-access memory, RAM for short); or the memory may include a non-volatile memory (non-volatile memory), such as a flash memory (flash memory), a hard disk drive (hard disk drive, HDD for short), or a solid state drive (solid-state drive, SSD for short); or the memory may include a combination of the foregoing types of memories.

The communications interface may be a wired communications interface, a wireless communications interface, or a combination thereof. The wired communications interface may be, for example, an Ethernet interface. The Ethernet interface may be an optical interface, an electrical interface, or a combination thereof. The wireless communications interface may be a WLAN interface.

The processor may be a central processing unit (central processing unit, CPU for short), a network processor (network processor, NP for short), or a combination of a CPU and an NP. The processor may further include a hardware chip. The hardware chip may be an application-specific integrated circuit (application-specific integrated circuit, ASIC for short), a programmable logic device (programmable logic device, PLD for short), or a combination thereof. The PLD may be a complex programmable logic device (complex programmable logic device, CPLD for short), a field-programmable gate array (field-programmable gate array, FPGA for short), generic array logic (generic array logic, GAL for short), or any combination thereof.

Optionally, the memory may be further configured to store a program instruction. The processor may perform one or more steps or an optional implementation in the embodiment shown in FIG. 2 by invoking the program instruction stored in the memory, so that the sector level sweep apparatus 400 implements a function in the foregoing method.

The processor is configured to generate a first sector sweep packet at a local end sector sweep stage.

The transceiver is configured to send the first sector sweep packet to a peer end by using a first beam, where a quantity of bytes of the first sector sweep packet is not greater than 27, the first sector sweep packet includes beam indication information of the first beam, the beam indication information includes antenna identification information of the beam, and a maximum quantity of antennas indicated by the antenna identification information is at least 8.

In this embodiment of this application, optionally, the first sector sweep packet may include an SSW frame and a short SSW packet. The SSW frame may include a DMG SSW frame defined in the prior art, or may include an EDMG SSW frame redefined in the embodiments of this application. The short SSW packet newly introduced in IEEE 802.11ay currently includes no MAC header, and therefore is referred to as the short SSW packet.

It can be learned through analysis that, the first sector sweep packet includes the beam indication information of the first beam, the beam indication information includes the antenna identification information of the beam, and the maximum quantity of antennas indicated by the antenna identification information is at least 8. In other words, the first sector sweep packet can indicate at least eight antennas. In addition, current multi-antenna application scenarios include a scenario with eight data streams. Therefore, a quantity of antennas that can be indicated by the first sector sweep packet can meet a current multi-antenna requirement. In addition, for a throughput requirement, a quantity of streams that need to be supported may further increase, and therefore a quantity of antennas that need to be indicated is extended.

In addition, because the quantity of bytes of the first sector sweep packet is not greater than 27, it may be determined through the foregoing calculation that a quantity of LDPC code blocks corresponding to the first sector sweep packet is not greater than 2. In addition, the quantity of LDPC code blocks corresponding to the first sector sweep packet is not greater than 2, and a current protocol specifies that a sector sweep packet corresponds to two LDPC code blocks. In this embodiment of this application, although the quantity of antennas that can be indicated by the first sector sweep packet increases, the quantity of LDPC code blocks corresponding to the first sector sweep packet does not increase. Therefore, in this embodiment of this application, a transmission latency of the sector sweep packet does not excessively increase, and a relatively large increase of transmission overheads is not caused.

Optionally, the beam indication information of the beam further includes beam identification information of the beam. In EDMG BRP training, a maximum quantity of antenna weight vectors (AWV, Antenna Weight Vector) that can be trained on each antenna has been extended to 2048. Therefore, in the first sector sweep packet provided in this embodiment of this application, a maximum quantity of beams indicated by the beam identification information of the beam is at least 2048. In this way, in this embodiment of this application, a quantity of beams that is of a single antenna and that can be indicated also increases, and is consistent with that at a BRP stage.

Optionally, for each of the local end sector sweep stage and a peer end sector sweep stage, a total quantity of sector sweep packets sent at each stage may be indicated by using countdown identification information at the sector sweep stage. The beam indication information further includes countdown identification information corresponding to the beam at the local end sector sweep stage, and a maximum quantity of beams indicated by the countdown identification information of the beam is at least 16384. In this way, in this embodiment of this application, a quantity of beams that can be indicated at the entire local end sector sweep stage also increases.

In an optional implementation solution, the quantity of bytes of the first sector sweep packet is still 26. In this embodiment of this application, this may be implemented by redefining some fields in a DMG SSW frame in an existing protocol. Optionally, the processor is configured to add the beam indication information of the first beam to a beam indication information field in the first sector sweep packet, to generate the first sector sweep packet, where the beam indication information field includes an extended beam indication information field and a first indication information field, and if the sector sweep packet at the local end sector sweep stage has 26 bytes, the first indication information field is used to instruct to define any one or more of a receive sector sweep length field in an SSW field in a DMG SSW frame, a signal-to-noise ratio report field in an SSW feedback field, and a reserved bit field as the extended beam indication information field. In this way, when the quantity of antennas that can be indicated by the first sector sweep packet increases, a length of the DMG SSW frame does not increase.

Based on the foregoing content, optionally, the first sector sweep packet or a second sector sweep packet in this embodiment of this application further includes the SSW feedback field, which is used to feed back preferred beam indication information at a previous stage. Optionally, the transceiver is further configured to receive a second sector sweep packet by using a second beam at a previous peer end sector sweep stage adjacent to the local end sector sweep stage, where the second sector sweep packet includes beam indication information of the second beam, and a quantity of bytes of the second sector sweep packet is not greater than 27. The processor is configured to: select to-be-fed-back beam indication information of each of at least one first to-be-fed-back beam from the sector sweep packet received at the previous peer end sector sweep stage adjacent to the local end sector sweep stage, and generate the first sector sweep packet based on the to-be-fed-back beam indication information of each of the at least one first to-be-fed-back beam and the beam indication information of the first beam, where the to-be-fed-back beam indication information includes beam identification information of the to-be-fed-back beam, and a maximum quantity of beams indicated by the beam identification information of the to-be-fed-back beam is at least 2048.

In an optional implementation solution, optionally, the to-be-fed-back beam indication information further includes antenna identification information of the to-be-fed-back beam, and a maximum quantity of antennas indicated by the antenna identification information of the to-be-fed-back beam is at least 8. If binary is used for representation, 3 bits are provided for the antenna identification information of the to-be-fed-back beam, and may indicate antenna identification information of eight to-be-fed-back beams. For a specific implementation, refer to the foregoing description, for example, Table 6 or Table 8 in the foregoing content.

Optionally, the first sector sweep packet includes 27 bytes, and at least two first to-be-fed-back beams are selected from the sector sweep packet received at the previous peer end sector sweep stage adjacent to the local end sector sweep stage. In this way, a bit corresponding to the antenna identification information of the to-be-fed-back beam can be saved. Further, a plurality of to-be-fed-back beams such as an optimal beam and a suboptimal beam on the antenna may be fed back. In other words, the bit saved in the solution provided in this embodiment of this application is used to transmit more to-be-fed-back beams.

Optionally, the transceiver is further configured to: send a sector sweep feedback frame to the peer end, and receive a sector sweep acknowledgement frame sent by the peer end; or receive a sector sweep feedback frame sent by the peer end, and send a sector sweep acknowledgement frame to the peer end. For each of the sector sweep feedback frame and the sector sweep acknowledgement frame, a quantity of occupied bytes is not greater than 48, and a quantity of occupied LDPC code blocks is not greater than 3.

Optionally, each of the sector sweep feedback frame and the sector sweep acknowledgement frame includes at least two sector sweep feedback fields, and each of the at least two sector sweep feedback fields includes to-be-fed-back beam indication information of at least two third to-be-fed-back beams corresponding to a same antenna.

Optionally, the transceiver is further configured to receive a third sector sweep packet by using a third beam at a subsequent peer end sector sweep stage adjacent to the local end sector sweep stage, where the third sector sweep packet includes to-be-fed-back beam indication information that is of a second to-be-fed-back beam and that is selected by the peer end from the sector sweep packet received at the local end sector sweep stage.

Optionally, the first sector sweep packet further includes indication information used to indicate whether a local end sector sweep stage next to the local end sector sweep stage exists. For example, the additional SLS indicator bit (Additional SLS) in Table 11 may have another name. In this way, an entire SLS stage is divided into a plurality of segments by mutually spaced ISS and RSS.

Optionally, if the sector sweep packet is a short SSW packet, information about a physical layer service data unit length field in the short SSW packet is 6, and the processor is configured to add beam indication information at the local end sector sweep stage to a beam indication information field that is at the local end sector sweep stage and that is in the sector sweep packet at the local end sector sweep stage, where the beam indication information field at the local end sector sweep stage includes the beam indication information field at the local end sector sweep stage, a beam information indication field obtained after extension at the local end sector sweep stage, and a second indication information field, and the second indication information field is used to define any one or more of a frame check sequence field, a packet type field, and a reserved bit field in the short SSW packet as the beam information indication field obtained after the extension at the local end sector sweep stage. The frame check sequence field may also be referred to as an FCS field in the short SSW packet. The packet type field may also be referred to as a packet type field in the short SSW packet. The reserved bit field may also be referred to as a reserved field in the short SSW packet. In this way, when a length of the DMG SSW frame does not increase, the quantity of antennas that can be indicated by the first sector sweep packet increases.

Persons skilled in the art should understand that the embodiments of this application may be provided as a method, or a computer program product. Therefore, this application may use a form of hardware only embodiments, software only embodiments, or embodiments with a combination of software and hardware. In addition, this application may use a form of a computer program product that is implemented on one or more computer usable storage media (including but not limited to a magnetic disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more processes in the flowcharts and/or in one or more blocks in the block diagrams.

These computer program instructions may be stored in a computer readable memory that can instruct a computer or another programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, to generate computer-implemented processing. Therefore, the instructions executed on the computer or the another programmable device provide steps for implementing a specific function in one or more processes in the flowcharts and/or in one or more blocks in the block diagrams.

Although some embodiments of this application have been described, persons skilled in the art can make other changes and modifications to these embodiments once they learn the basic inventive concept. Therefore, the appended claims are intended to be construed as to cover the preferred embodiments and all changes and modifications falling within the scope of this application.

Apparently, persons skilled in the art can make various modifications and variations to this application without departing from the spirit and scope of this application. In this way, this application is intended to cover these modifications and variations of this application provided that they fall within the scope of the claims of this application and their equivalent technologies.

What is claimed is:

1. A sector level sweep method, comprising:
   generating, by a local end, a first sector sweep packet at a local end sector sweep stage; and sending, by the local end, the first sector sweep packet to a peer end by using a first beam, wherein
  a quantity of bytes of the first sector sweep packet is 27; and
  the first sector sweep packet comprises beam indication information of the first beam, the beam indication information comprises antenna identification information of the beam.

2. The method according to claim 1, wherein the beam indication information further comprises beam identification information of the beam; and
  a maximum quantity of beams indicated by the beam identification information of the beam is at least 2048.

3. The method according to claim 1, wherein the beam indication information further comprises countdown identification information corresponding to the beam at the local end sector sweep stage; and
  a maximum quantity of beams indicated by the countdown identification information of the beam is at least 16384.

4. The method according to claim 1, wherein before the generating, by a local end, a first sector sweep packet, the method further comprises:
  receiving, by the local end, a second sector sweep packet by using a second beam at a previous peer end sector sweep stage adjacent to the local end sector sweep stage, wherein the second sector sweep packet comprises beam indication information of the second beam, and a quantity of bytes of the second sector sweep packet is not greater than 27; and
  the generating, by a local end, a first sector sweep packet comprises:
  selecting, by the local end, to-be-fed-back beam indication information of each of at least one first to-be-fed-back beam from the second sector sweep packet received at the previous peer end sector sweep stage adjacent to the local end sector sweep stage; and
  generating, by the local end, the first sector sweep packet based on the to-be-fed-back beam indication information of each of the at least one first to-be-fed-back beam and the beam indication information of the first beam, wherein
  the to-be-fed-back beam indication information comprises beam identification information of the to-be-fed-back beam, and a maximum quantity of beams indicated by the beam identification information of the to-be-fed-back beam is at least 2048.

5. The method according to claim 4, wherein the to-be-fed-back beam indication information further comprises antenna identification information of the to-be-fed-back beam; and
  a maximum quantity of antennas indicated by the antenna identification information of the to-be-fed-back beam is at least 8.

6. The method according to claim 5, wherein the local end selects at least two first to-be-fed-back beams from the sector sweep packet received at the previous peer end sector sweep stage adjacent to the local end sector sweep stage.

7. The method according to claim 1, after the sending, by the local end, the first sector sweep packet to a peer end by using a first beam, further comprising:
  sending, by the local end, a sector sweep feedback frame to the peer end, and receiving, by the local end, a sector sweep acknowledgement frame sent by the peer end; or
  receiving, by the local end, a sector sweep feedback frame sent by the peer end, and sending, by the local end, the sector sweep acknowledgement frame to the peer end, wherein
  for each of the sector sweep feedback frame and the sector sweep acknowledgement frame, a quantity of occupied bytes is not greater than 48, and a quantity of occupied Low-Density Parity-check Code (LDPC) code blocks is not greater than 3.

8. The method according to claim 7, wherein each of the sector sweep feedback frame and the sector sweep acknowledgement frame comprises at least two sector sweep feedback fields; and
  each of the at least two sector sweep feedback fields comprises:
  to-be-fed-back beam indication information of at least two third to-be-fed-back beams corresponding to a same antenna.

9. The method according to claim 4, after the sending, by the local end, the first sector sweep packet to a peer end by using the first beam, further comprising:
  receiving, by the local end, a third sector sweep packet by using a third beam at a subsequent peer end sector sweep stage adjacent to the local end sector sweep stage, wherein
  the third sector sweep packet comprises to-be-fed-back beam indication information that is of a second to-be-fed-back beam and that is selected by the peer end from the sector sweep packet received at the local end sector sweep stage.

10. The method according to claim 9, wherein the first sector sweep packet further comprises:
  indication information used to indicate whether a local end sector sweep stage next to the local end sector sweep stage exists.

11. The method according to claim 1, wherein when the sector sweep packet is a short SSW packet, information about a physical layer service data unit length field in the short Sector Sweep (SSW) packet is 6 bytes; and
  the local end adds beam indication information at the local end sector sweep stage to the sector sweep packet at the local end sector sweep stage, comprising:
  adding, by the local end, the beam indication information at the local end sector sweep stage to a beam indication information field that is at the local end sector sweep stage and that is in the sector sweep packet at the local end sector sweep stage, wherein
  the beam indication information field at the local end sector sweep stage comprises the beam indication information field at the local end sector sweep stage, a beam indication information field obtained after extension at the local end sector sweep stage, and a second indication information field; and
  the second indication information field is used to define any one or more of a frame check sequence field, a packet type field, and a reserved bit field in the short SSW packet as the beam information indication field obtained after the extension at the local end sector sweep stage.

12. A sector level sweep apparatus, comprising:
  a processor, configured to generate a first sector sweep packet at the local end sector sweep stage; and
  a transceiver, configured to send the first sector sweep packet to a peer end by using a first beam, wherein
  a quantity of bytes of the first sector sweep packet is 27; and the first sector sweep packet comprises beam indication information of the first beam, the beam indication information comprises antenna identification information of the beam.

13. The apparatus according to claim 12, wherein the beam indication information further comprises beam identification information of the beam; and
a maximum quantity of beams indicated by the beam identification information of the beam is at least 2048.

14. The apparatus according to claim 12, wherein the beam indication information further comprises countdown identification information corresponding to the beam at the local end sector sweep stage; and
a maximum quantity of beams indicated by the countdown identification information of the beam is at least 16384.

15. The apparatus according to claim 12, wherein the transceiver is further configured to:
receive a second sector sweep packet by using a second beam at a previous peer end sector sweep stage adjacent to the local end sector sweep stage, wherein the second sector sweep packet comprises beam indication information of the second beam, and a quantity of bytes of the second sector sweep packet is not greater than 27; and
the processor is configured to:
select to-be-fed-back beam indication information of each of at least one first to-be-fed- back beam from the sector sweep packet received at the previous peer end sector sweep stage adjacent to the local end sector sweep stage; and
generate the first sector sweep packet based on the to-be-fed-back beam indication information of each of the at least one first to-be-fed-back beam and the beam indication information of the first beam, wherein
the to-be-fed-back beam indication information comprises beam identification information of the to-be-fed-back beam, and a maximum quantity of beams indicated by the beam identification information of the to-be-fed-back beam is at least 2048.

16. The apparatus according to claim 15, wherein the to-be-fed-back beam indication information further comprises antenna identification information of the to-be-fed-back beam; and a maximum quantity of antennas indicated by the antenna identification information of the to-be-fed-back beam is at least 8.

17. The apparatus according to claim 15, wherein the first sector sweep packet comprises 27 bytes; and
at least two first to-be-fed-back beams are selected from the sector sweep packet received at the previous peer end sector sweep stage adjacent to the local end sector sweep stage.

18. The apparatus according to claim 12, wherein the transceiver is further configured to:
send a sector sweep feedback frame to the peer end, and receive a sector sweep acknowledgement frame sent by the peer end; or
receive a sector sweep feedback frame sent by the peer end, and send the sector sweep acknowledgement frame to the peer end, wherein
for each of the sector sweep feedback frame and the sector sweep acknowledgement frame, a quantity of occupied bytes is not greater than 48, and a quantity of occupied Low-Density Parity-check Code (LDPC) code blocks is not greater than 3.

19. The apparatus according to claim 18, wherein each of the sector sweep feedback frame and the sector sweep acknowledgement frame comprises at least two sector sweep feedback fields; and
each of the at least two sector sweep feedback fields comprises:
to-be-fed-back beam indication information of at least two third to-be-fed-back beams corresponding to a same antenna.

20. The apparatus according to claim 15, wherein the transceiver is further configured to:
receive a third sector sweep packet by using a third beam at a subsequent peer end sector sweep stage adjacent to the local end sector sweep stage, wherein
the third sector sweep packet comprises to-be-fed-back beam indication information that is of a second to-be-fed-back beam and that is selected by the peer end from the sector sweep packet received at the local end sector sweep stage.

* * * * *